United States Patent
Tsunoda

(10) Patent No.: US 8,804,225 B2
(45) Date of Patent: Aug. 12, 2014

(54) SIGNAL SHAPING CIRCUIT AND LIGHT TRANSMITTING DEVICE

(75) Inventor: Yukito Tsunoda, Isehara (JP)

(73) Assignee: Fujitsu Limited, Kawasaki (JP)

( * ) Notice: Subject to any disclaimer, the term of this patent is extended or adjusted under 35 U.S.C. 154(b) by 162 days.

(21) Appl. No.: 13/566,542

(22) Filed: Aug. 3, 2012

(65) Prior Publication Data

US 2013/0077149 A1 Mar. 28, 2013

(30) Foreign Application Priority Data

Sep. 27, 2011 (JP) ................................. 2011-211619

(51) Int. Cl.
*G02F 1/03* (2006.01)
*H03H 15/00* (2006.01)
(52) U.S. Cl.
CPC ..................................... *H03H 15/00* (2013.01)
USPC .......................................................... 359/245
(58) Field of Classification Search
USPC ........................................... 345/245; 359/245
See application file for complete search history.

(56) References Cited

U.S. PATENT DOCUMENTS 8,352,526 B1 * 1/2013 Alfke ............................ 708/271
2004/0113656 A1 6/2004 Sato

FOREIGN PATENT DOCUMENTS

JP 2004-88693 3/2004

OTHER PUBLICATIONS

Stefan Andersson, et al., "A tuned, inductorless, recursive filter LNA in CMOS", ESSCIRC2002, pp. 351-354, Sep. 2002.

* cited by examiner

*Primary Examiner* — James Jones
(74) *Attorney, Agent, or Firm* — Staas & Halsey LLP

(57) ABSTRACT

A signal shaping circuit includes an operational circuit that provides weights to a first signal input to a first input element and a second signal input to a second input element, adds or subtracts the second signal to or from the first signal, and outputs a signal obtained by adding or subtracting the second signal to or from the first signal; a divider that divides the signal output from the operational circuit into signals, causes one of the divided signal to be input to the second input element, and outputs the other of the divided signal; a delay element that delays the signal output from the operational circuit and to be input to the divider or the signal output from the divider and to be input to the second input element; and an adjuster that adjusts at least one of the weights provided to the first and second signals.

12 Claims, 31 Drawing Sheets

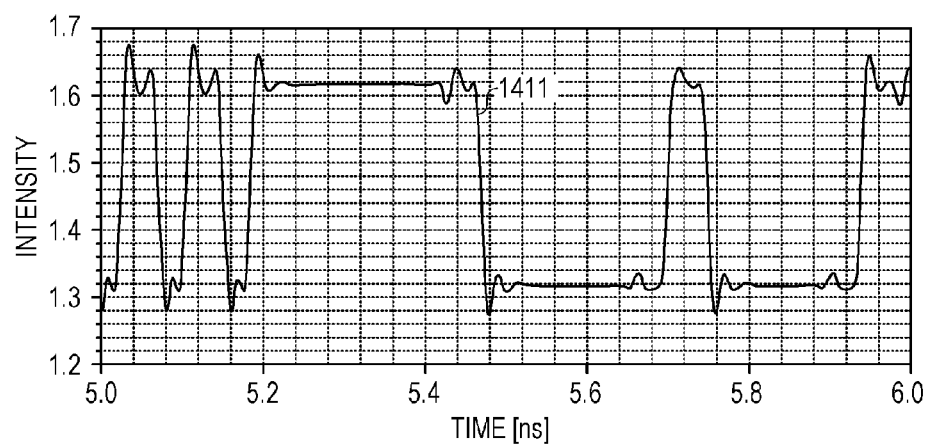
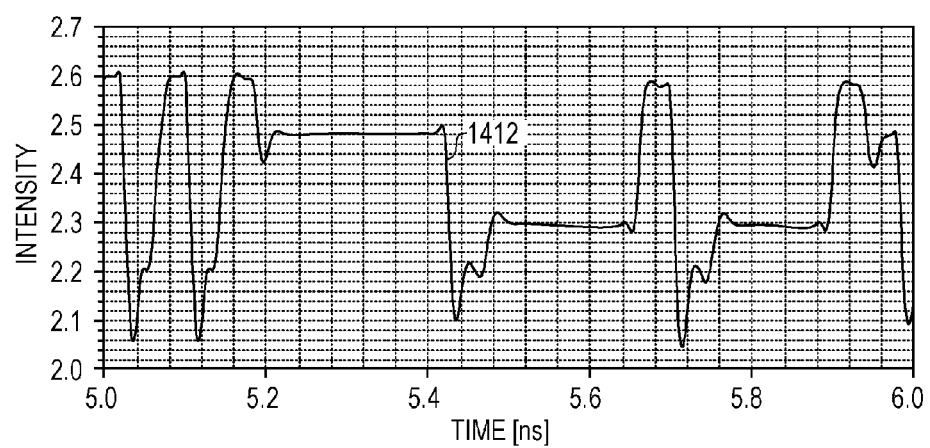

SIGNAL SHAPING CIRCUIT AND LIGHT TRANSMITTING DEVICE

CROSS-REFERENCE TO RELATED APPLICATION

This application is based upon and claims the benefit of priority of the prior Japanese Patent Application No. 2011-211619, filed on Sep. 27, 2011, the entire contents of which are incorporated herein by reference.

FIELD

The embodiments discussed herein are related to a signal shaping circuit and an electromagnetic wave outputting device.

BACKGROUND

In the communication field in recent years, data rates are becoming higher, since due to an increase in amount of communication data, each signal transmits a large amount of data. Thus, data rates are becoming higher in recent years. High-speed data is highly likely to be degraded due to intersymbol interference or the like occurred in a cable, a board, an output device or the like. An emphasis signal (pre-emphasis signal) that has an emphasized component in which intersymbol interference easily occurs is therefore used in consideration of a component that may be degraded due to a lack of a band in some cases.

As an example of a method for generating the emphasis signal, a finite impulse response (FIR) method for dividing a signal into signals, providing the difference between delays of the divided signals, and adding or subtracting one of the divided signals to or from the other of the divided signal is known (refer to, for example, Japanese Laid-open Patent Publication No. 2004-88693). In addition, a technique for achieving a bandpass filter using an infinite impulse response (IIR) filter in a wireless communication device is known (refer to, for example, Japanese Laid-open Patent Publication No. 2004-88693, and Stefan Andersson, Peter Caputa, and Christer Svensson, "A tuned, inductorless, recursive filter LNA in CMOS", ESSCIRC2002 Pp. 351-354).

In the aforementioned techniques, however, the degree of emphasis is low, and it is therefore difficult to flexibly shape a signal on the basis of a requested signal waveform.

SUMMARY

According to an aspect of the embodiments, an apparatus includes

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 14A illustrates an example of results of simulation of a feedback signal before the adjustment.

FIG. 14B illustrates an example of results of simulation of an output signal before the adjustment.

DESCRIPTION OF EMBODIMENTS

Hereinafter, embodiments of a signal shaping circuit disclosed herein and a light transmitting device disclosed herein are described in detail with reference to the accompanying drawings.

First Embodiment

Configuration of Signal Shaping Circuit

Figure 1A:
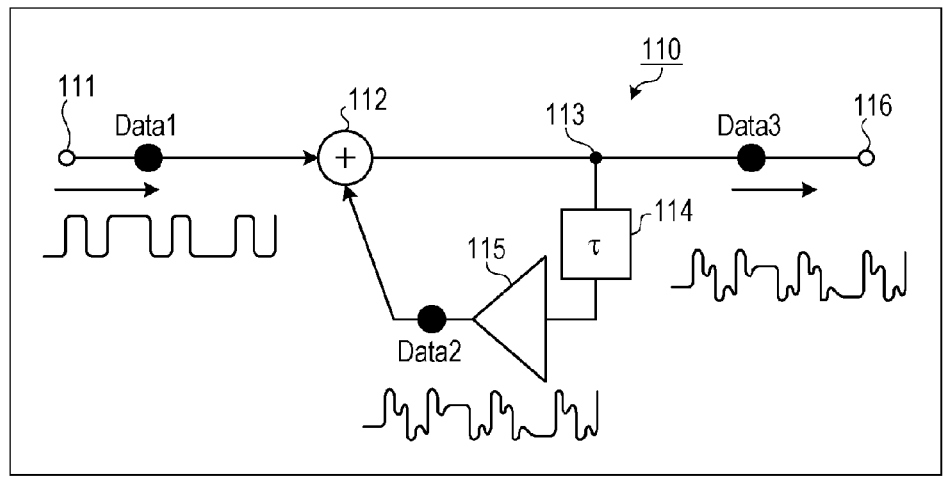
FIG. 1A illustrates an example of the configuration of a signal shaping circuit according to a first embodiment.

FIG. 1A illustrates an example of the configuration of a signal shaping circuit according to the first embodiment. A signal shaping circuit 110 illustrated in FIG. 1A is a signal shaping circuit that shapes an input signal and outputs the shaped signal. For example, the signal shaping circuit 110 shapes a driving signal to be input to a light outputting element such as a vertical cavity surface emitting laser (VCSEL). The signal to be shaped by the signal shaping circuit 110, however, is not limited to the driving signal to be input to the light outputting element.

As illustrated in FIG. 1A, the signal shaping circuit 110 includes an input element 111, an operational circuit 112, a divider 113, a delay element 114, a buffer circuit 115 and an output element 116. A signal to be shaped is input to the input element 111. For example, the signal input to the input element 111 is a differential signal that includes a normal phase signal and a reverse phase signal. The input element 111 outputs the input signal as an input signal Data1 to the operational circuit 112. In this specification, the output element 116 includes a terminal and a line that is connected to another circuit.

The operational circuit 112 includes a first input element and a second input element. The input signal Data1 (first signal) output from the input element 111 is input to the first input element of the operational circuit 112. A feedback signal Data2 (second signal) is output from the buffer circuit 115 and input to the second input element of the operational circuit 112. The operational circuit 112 is an operational circuit that provides weights to the input signal Data1 and the feedback signal Data2 and adds or subtracts the feedback signal Data2 to or from the input signal Data1. The operational circuit 112 outputs, as an output signal Data3, a signal obtained by adding or subtracting the feedback signal Data2 to or from the input signal Data1. Input elements that are described in this specification and are the first and second input elements and the like may be terminals, pads, lines connected to another circuit, or the like.

The divider 113 divides the signal Data3 output from the operational circuit 112 into signals. The divider 113 outputs one of the divided signals to the output element 116 and outputs, as the feedback signal Data2, the other of the divided signal to the delay element 114.

The delay element 114 is a delay element that delays the feedback signal Data2 output from the divider 113. The delay element 114 outputs the delayed feedback signal Data2 to the buffer circuit 115. The buffer circuit 115 controls output of the feedback signal Data2 output from the delay element 114 and outputs the controlled signal as the feedback signal Data2 to the operational circuit 112.

The feedback signal Data2 output from the buffer circuit 115 is input to the second input element of the operational circuit 112. The delay element 114 and the buffer circuit 115 form a feedback element that returns the feedback signal Data2 output from the divider 114 to the second input element of the operational circuit 112. The output element 116 outputs the signal Data3 output from the divider 113 to the other circuit located on the downstream side of the signal shaping circuit 110.

In this manner, the signal shaping circuit 110 shapes the input signal Data1 using an IIR method in which the output signal Data3 is returned to the operational circuit 112 as the feedback signal Data2 and added to or subtracted from the input signal Data1. The signal shaping circuit 110 outputs the shaped signal as the output signal Data3. For example, the signal shaping circuit 110 emphasizes or suppresses a specific high-frequency component of the input signal Data1. An example in which the signal shaping circuit 110 emphasizes the specific high-frequency component of the input signal Data1 is described below.

FIG. 1A illustrates the configuration in which the buffer circuit 115 is located on the downstream side of the delay element 114. The buffer circuit 115, however, may be located on the upstream side of the delay element 114. In addition, FIG. 1A illustrates the configuration in which the delay element 114 is located on the downstream side of the divider 113 and the upstream side of the buffer circuit 115. The delay element 114, however, may be located on the downstream side of the operational circuit 112 and the upstream side of the divider 113. Furthermore, FIG. 1A illustrates the configuration in which the buffer circuit 115 is located on the downstream side of the divider 113 and the downstream side of the delay element 114. The buffer circuit 115, however, may be located on the downstream side of the operational circuit 112 and the upstream side of the divider 113.

Example of Configuration of FIR Type Signal Shaping Circuit

Figure 1B:
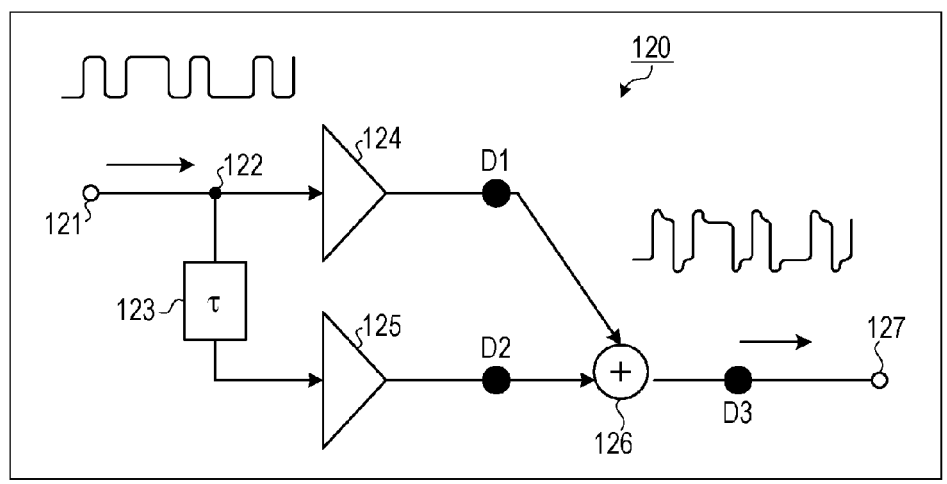
FIG. 1B illustrates an example of the configuration of an FIR type signal shaping circuit.

FIG. 1B illustrates, as a reference, an example of the configuration of an FIR type signal shaping circuit that uses an FIR method. As illustrated in FIG. 1B, an FIR type signal shaping circuit 120 includes an input element 121, a divider 122, a delay element 123, buffer circuits 124, 125, an operational circuit 126 and an output element 127.

A signal to be shaped is input to the input element 121. The input element 121 outputs the input signal to the divider 122. The divider 122 divides the signal output from the input element 121 into signals. The divider 122 outputs one of the divided signals as a divided signal D1 to the buffer circuit 124 and outputs the other of the divided signal as a divided signal D2 to the delay element 123.

The delay element 123 delays the divided signal D2 output from the divider 122. The delay element 123 outputs the delayed divided signal D2 to the buffer circuit 125. A delay τ that is provided by the delay element 123 is equal to a delay τ that is provided by the delay element 114 illustrated in FIG. 1A, for example.

The buffer circuit 124 controls output of the divided signal D1 output from the divider 122. The buffer circuit 124 outputs the controlled divided signal D1 to the operational circuit 126. The buffer circuit 125 controls output of the divided signal D2 output from the delay element 123. The buffer circuit 125 outputs the controlled divided signal D2 to the operational circuit 126.

The operational circuit 126 provides weights to the divided signal D1 output from the buffer circuit 124 and the divided signal D2 output from the buffer circuit 125 and adds or subtracts one of the divided signals D1 and D2 to or from the other of the divided signal. Then, the operational circuit 126 outputs, as an output signal D3, a signal obtained by adding or subtracting one of the divided signals D1 and D2 to or from the other of the divided signal. The weights (addition ratios) that are provided by the operational circuit 126 are equal to the weights provided by the operational circuit 112 illustrated in FIG. 1A, for example. The output element 127 outputs the signal D3 output from the operational circuit 126.

Signals of IIR and FIR Type Signal Shaping Circuits

Figure 2:
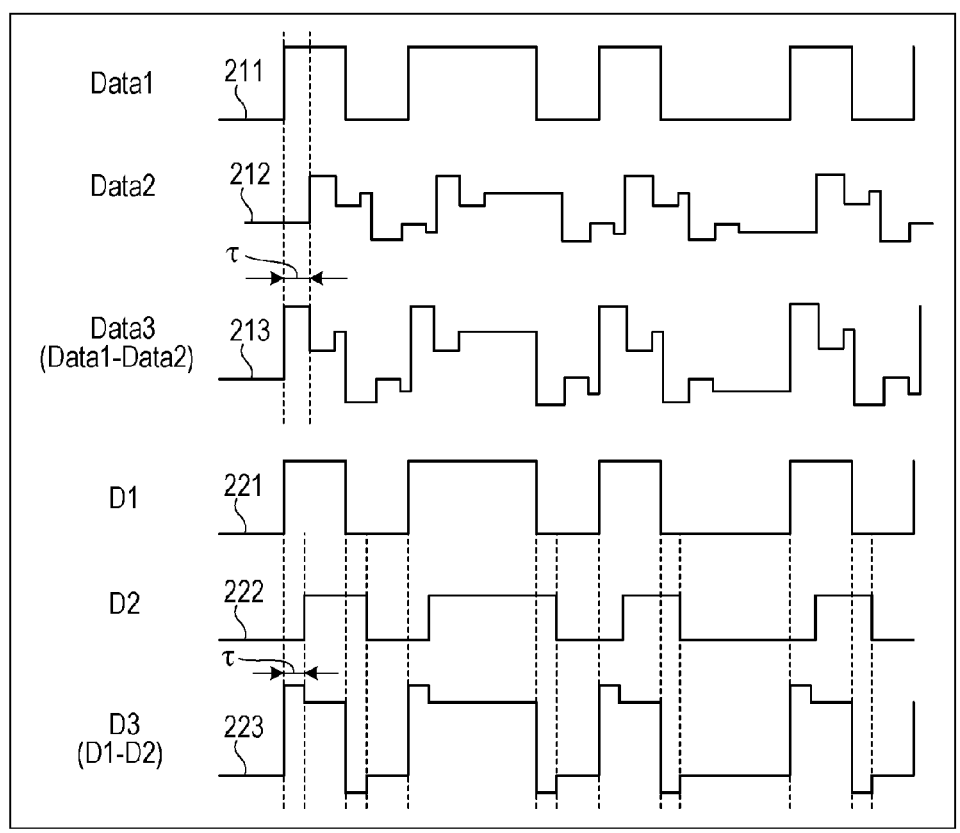
FIG. 2 illustrates an example of signals of the IIR type signal shaping circuit and FIR type signal shaping circuit.

FIG. 2 illustrates an example of the signals of the IIR and FIR type signal shaping circuits 110 and 120. In FIG. 2, the abscissa indicates time. Waveforms 211 to 213 indicate a waveform of the signal Data1 input to the IIR type signal shaping circuit 110, a waveform of the feedback signal Data2 and a waveform of the output signal Data3, respectively. FIG. 2 illustrates an example in which the operational circuit 112 subtracts the feedback signal Data2 from the input signal Data1 and outputs the result of the subtraction as the output signal Data3.

Waveforms 221 to 223 are illustrated as a reference and indicate waveforms of the divided signals D1, D2 and output signal D3 of the FIR type signal shaping circuit 120, respectively. FIG. 2 illustrates an example in which the operational circuit 126 subtracts the divided signal D2 from the divided signal D1 and outputs the result of the subtraction as the output signal D3.

As indicated by the waveforms 211 to 213 and 221 to 223, the IIR type signal shaping circuit 110 (illustrated in FIG. 1A) may emphasize a high-frequency component of a signal and thereby make the high-frequency component have a higher intensity, compared with the FIR type signal shaping circuit 120 (illustrated in FIG. 1B). For example, the signal shaping circuit 110 may emphasize a rising part of the signal so as to make the rising part steeper.

Characteristics of Emphasis by IIR and FIR Type Signal Shaping Circuits

Figure 3:
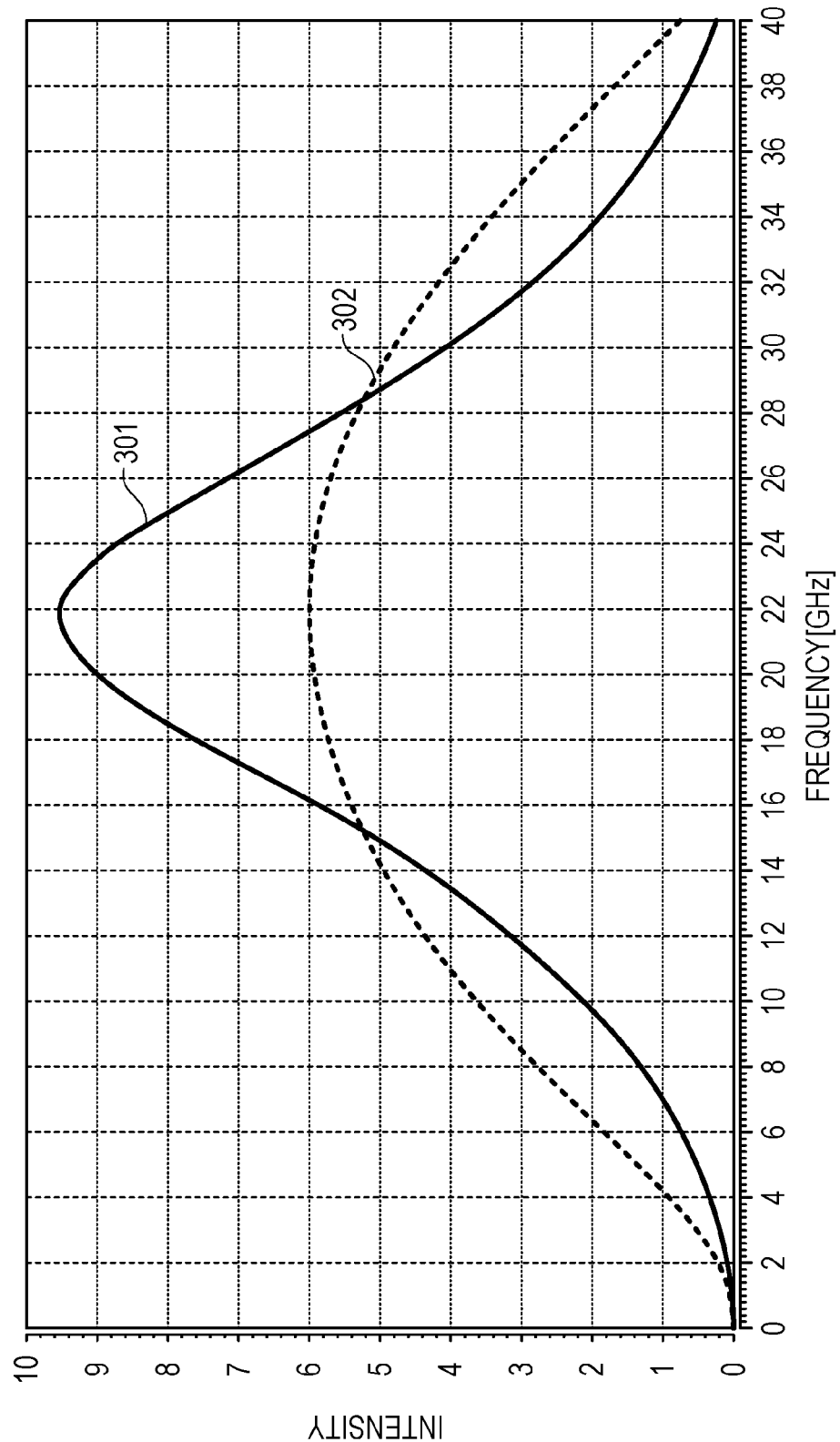
FIG. 3 illustrates an example of characteristics of emphasis performed by the IIR type signal shaping circuit and FIR type signal shaping circuit.

FIG. 3 illustrates an example of characteristics of emphasis performed by the IIR and FIR type signal shaping circuits 110 and 120. In FIG. 3, the abscissa indicates the frequency (GHz) of a signal, and the ordinate indicates the intensity of the signal. Emphasis characteristics 301 indicate characteristics of the intensity of the signal Data3 output from the signal shaping circuit 110 with respect to the frequency of the signal Data3. Emphasis characteristics 302 are illustrated as a reference and indicate characteristics of the intensity of the signal D3 output from the signal shaping circuit 120 with respect to the frequency of the signal D3.

As indicated by the emphasis characteristics 301 and 302, the signal shaping circuit 110 may emphasize a specific high-frequency component (for example, a component with a frequency of approximately 22 GHz) more strongly than the signal shaping circuit 120 and obtain an emphasis signal having the emphasized high-frequency component.

Configurations of Operational Circuits

Figure 4:
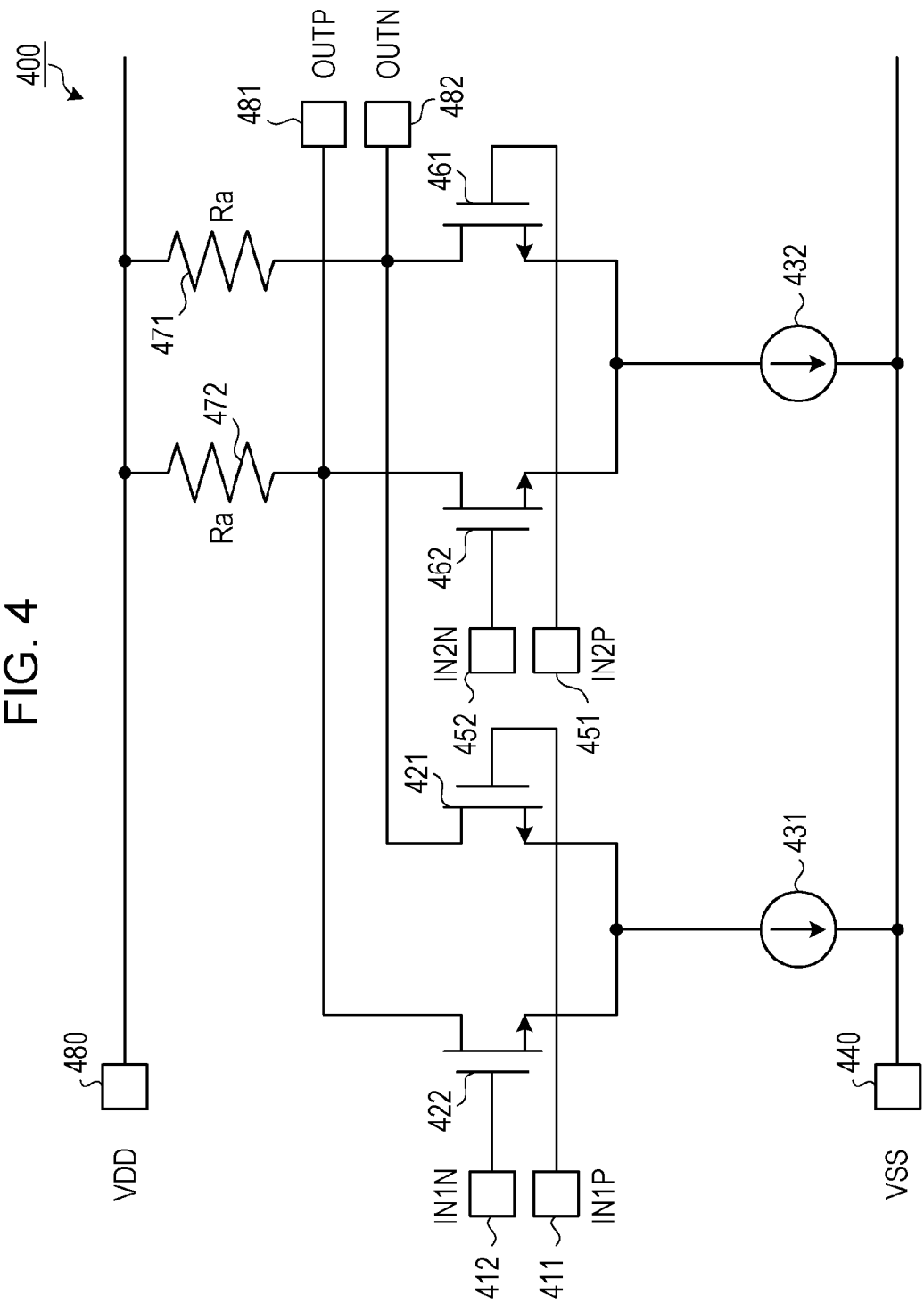
FIG. 4 illustrates an example of the configuration of an operational circuit illustrated in FIGS. 1A and 1B.

FIG. 4 illustrates an example of the configurations of the operational circuits 112 and 126 illustrated in FIGS. 1A and 1B. The operational circuit 112 illustrated in FIG. 1A may be achieved by an operational circuit 400 illustrated in FIG. 4. The operational circuit 400 includes input elements 411 and 412, transistors 421 and 422, current sources 431 and 432 and a ground 440. The operational circuit 400 further includes input elements 451 and 452, transistors 461 and 462, resistors 471 and 472, a power supply 480 and output elements 481 and 482.

The input elements 411 and 412 (IN1P, IN1N) form a first input element to which the normal phase signal and reverse phase signal of the signal Data1 output from the input element 111 are input. The input element 411 is connected to a gate of the transistor 421. The input element 412 is connected to a gate of the transistor 422.

A source of the transistor 421 is connected to the current source 431. A drain of the transistor 421 is connected to the resistor 471 and the output element 482. A source of the transistor 422 is connected to the current source 431. A drain of the transistor 422 is connected to the resistor 472 and the output element 481. One of ends of the current source 431 is connected to the sources of the transistors 421 and 422, while the other end of the current source 431 is connected to the ground 440 (VSS).

The input elements 451 and 452 (IN2P, IN2N) form a second input element to which a normal phase signal and reverse phase signal of the feedback signal Data2 output from the buffer circuit 115 are input. The input element 451 is connected to a gate of the transistor 461. The input element 452 is connected to a gate of the transistor 462.

A source of the transistor 461 is connected to the current source 432. A drain of the transistor 461 is connected to the resistor 471 and the output element 482. A source of the transistor 462 is connected to the current source 432. A drain of the transistor 462 is connected to the resistor 472 and the output element 481.

One of ends of the current source 432 is connected to the sources of the transistors 461 and 462, while the other end of the current source 432 is connected to the ground 440 (VSS). One of ends of the resistor 471 is connected to the drains of the transistors 421 and 461, while the other end of the resistor 471 is connected to the power supply 480 (VDD). One of ends of the resistor 472 is connected to the drains of the transistors 422 and 462, while the other end of the resistor 472 is connected to the power supply 480 (VDD).

The output element 481 (OUTP) outputs, as normal phase signals, signals output from the transistors 422 and 462. The output element 482 (OUTN) outputs, as reverse phase signals, signals output from the transistors 421 and 461. Thus, the operational circuit 400 may output, as the output signal Data3, a signal obtained by adding the signal Data1 output from the input element 111 to the feedback signal Data2 output from the buffer circuit 115.

The feedback signal Data2 may be subtracted from the input signal Data1 by switching between the normal phase signal and the reverse phase signal. For example, the feedback signal Data2 may be subtracted from the input signal Data1 by inputting the reverse phase signal of the feedback signal Data2 to the input element 451 and inputting the normal phase signal of the feedback signal Data2 to the input element 452.

The weight that is added to or subtracted from the input signal Data1 may be determined by a current value of the current source 431 or the like, for example. The weight that is added to or subtracted from the feedback signal Data2 may be determined by a current value of the current source 432 or the like, for example. The transistors 421, 422, 461 and 462 are field effect transistors (FETs), for example.

Configurations of Delay Element and Buffer Circuit

Figure 5:
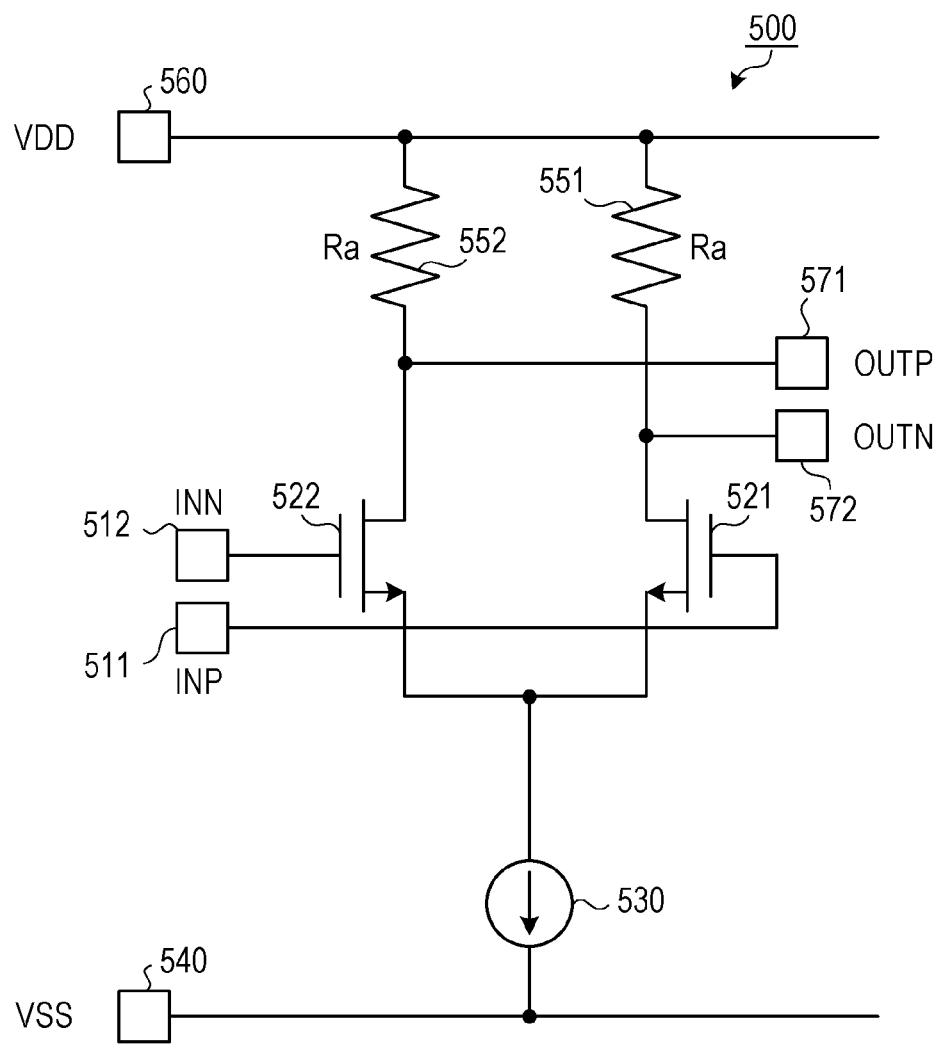
FIG. 5 illustrates an example of the configurations of delay elements and buffer circuits that are illustrated in FIGS. 1A and 1B.

FIG. 5 illustrates an example of the configuration of the delay element 114 illustrated in FIG. 1A and the configuration of the buffer circuit 115 illustrated in FIG. 1A. The delay element 114 and the buffer circuit 115 that are illustrated in FIG. 1A may be achieved by a delay buffer circuit 500 illustrated in FIG. 5. The delay buffer circuit 500 includes input elements 511 and 512, transistors 521 and 522, a current source 530, a ground 540, resistors 551 and 552, a power supply 560 and output elements 571 and 572.

The normal phase signal and reverse phase signal of the feedback signal Data2 input to the delay buffer circuit 500 are input to the input elements 511 and 512 (INP, INN), respectively. The input element 511 is connected to a gate of the transistor 521. The input element 512 is connected to a gate of the transistor 522.

The transistors 521 and 522 are FETs, for example. A source of the transistor 521 is connected to the current source 530. A drain of the transistor 521 is connected to the resistor 551 and the output element 572. A source of the transistor 522 is connected to the current source 530. A drain of the transistor 522 is connected to the resistor 552 and the output element 571.

One of ends of the current source 530 is connected to the sources of the transistors 521 and 522, while the other end of the current source 530 is connected to the ground 540 (VSS). One of ends of the resistor 551 is connected to the drain of the transistor 521, while the other end of the resistor 551 is connected to the power supply 560 (VDD). One of ends of the resistor 552 is connected to the drain of the transistor 522, while the other end of the resistor 552 is connected to the power supply 560.

The output element 571 outputs, as the normal phase signal, the signal output from the transistor 522. The output element 572 outputs, as the reverse phase signal, the signal output from the transistor 521. Thus, the delay buffer circuit 500 may provide a delay and a gain to the feedback signal Data2 input to the delay buffer circuit 500, and may output the feedback signal Data2. In this case, the gain that is provided to the feedback signal Data2 by the delay buffer circuit 500 may be determined by the magnitude of a current to be supplied by the current source 530.

Configuration of Light Transmitting Device

Figure 6:
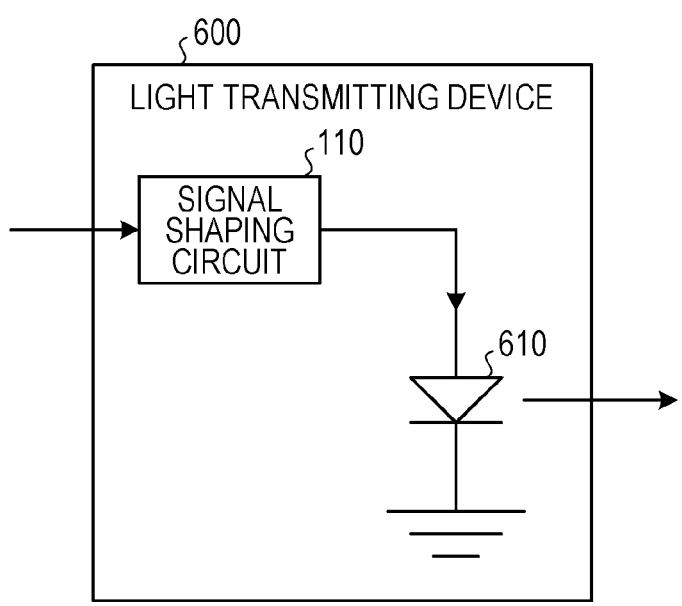
FIG. 6 illustrates an example of the configuration of a light transmitting device according to the first embodiment.

FIG. 6 illustrates an example of the configuration of a light transmitting device according to the first embodiment. A light transmitting device 600 illustrated in FIG. 6 transmits signal light based on the input driving signal. For example, the light transmitting device 600 includes the signal shaping circuit 110 illustrated in FIG. 1A and a light outputting element 610. The signal shaping circuit 110 shapes the driving signal input to the light transmitting device 600 and outputs the shaped driving signal to the light outputting element 610.

The light outputting element 610 is a laser diode (LD) such as a VCSEL, for example. The light outputting element 610 outputs signal light that has an intensity modulated on the basis of the driving signal output from the signal shaping circuit 110. Thus, the light transmitting device 600 may transmit the signal light based on the input driving signal.

In this manner, the signal shaping circuit 110 according to the first embodiment may use an IIR filter to shape the input signal more flexibly, while the IIR filter adds or subtracts a signal obtained by dividing the output returned signal to or from the input signal. The light transmitting device 600 according to the first embodiment may use the signal shaping circuit 110 to flexibly shape the driving signal. The light transmitting device 600 according to the first embodiment may flexibly shape the driving signal on the basis of a requested waveform of signal light or a characteristic of the light outputting element 610 and transmit high-quality signal light.

Second Embodiment

Parts that are different from the first embodiment are described in the second embodiment.

Configuration of Signal Shaping Circuit

Figure 7:
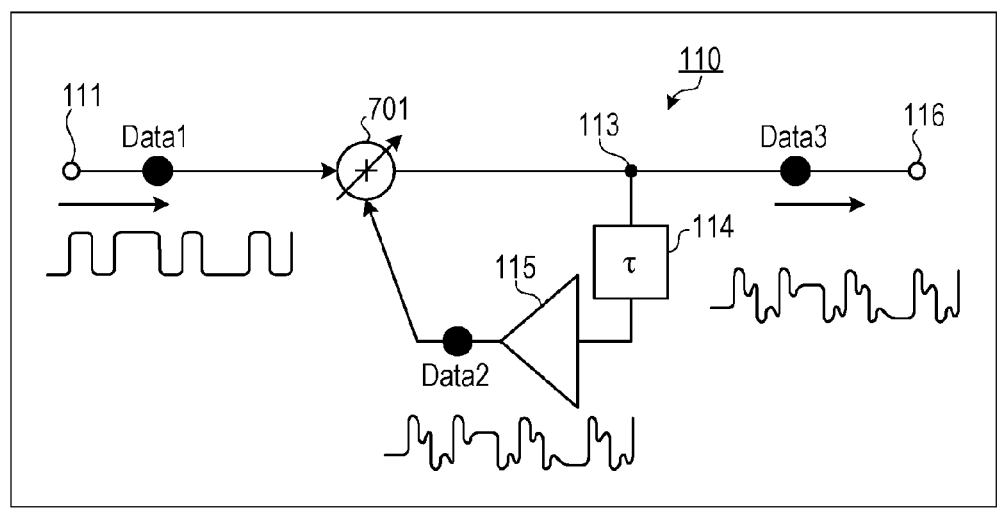
FIG. 7 illustrates an example of the configuration of a signal shaping circuit according to a second embodiment.

FIG. 7 illustrates an example of the configuration of a signal shaping circuit 110 according to the second embodiment. In FIG. 7, parts that are the same as the parts illustrated in FIG. 1A are indicated by the same reference numerals and symbols, and a description thereof is omitted. As illustrated in FIG. 7, the signal shaping circuit 110 according to the second embodiment includes a variable operational circuit 701 instead of the operational circuit illustrated in FIG. 1A.

The variable operational circuit 701 is an operational circuit (refer to, for example, FIGS. 8A and 8B) formed by adding, to the operational circuit 112 illustrated in FIG. 1A, an adjuster that adjusts at least one of a weight to be added to or subtracted from the input signal Data1 (first signal) and a weight to be added to or subtracted from the feedback signal Data2 (second signal). For example, the variable operational circuit 701 is an operational circuit that outputs a signal obtained by adding or subtracting a signal obtained by multiplying the feedback signal Data2 by a second ratio to or from a signal obtained by multiplying the input signal Data1 by a first ratio and is capable of adjusting at least one of the first and second ratios.

Configuration of Operational Circuit

Figure 8A:
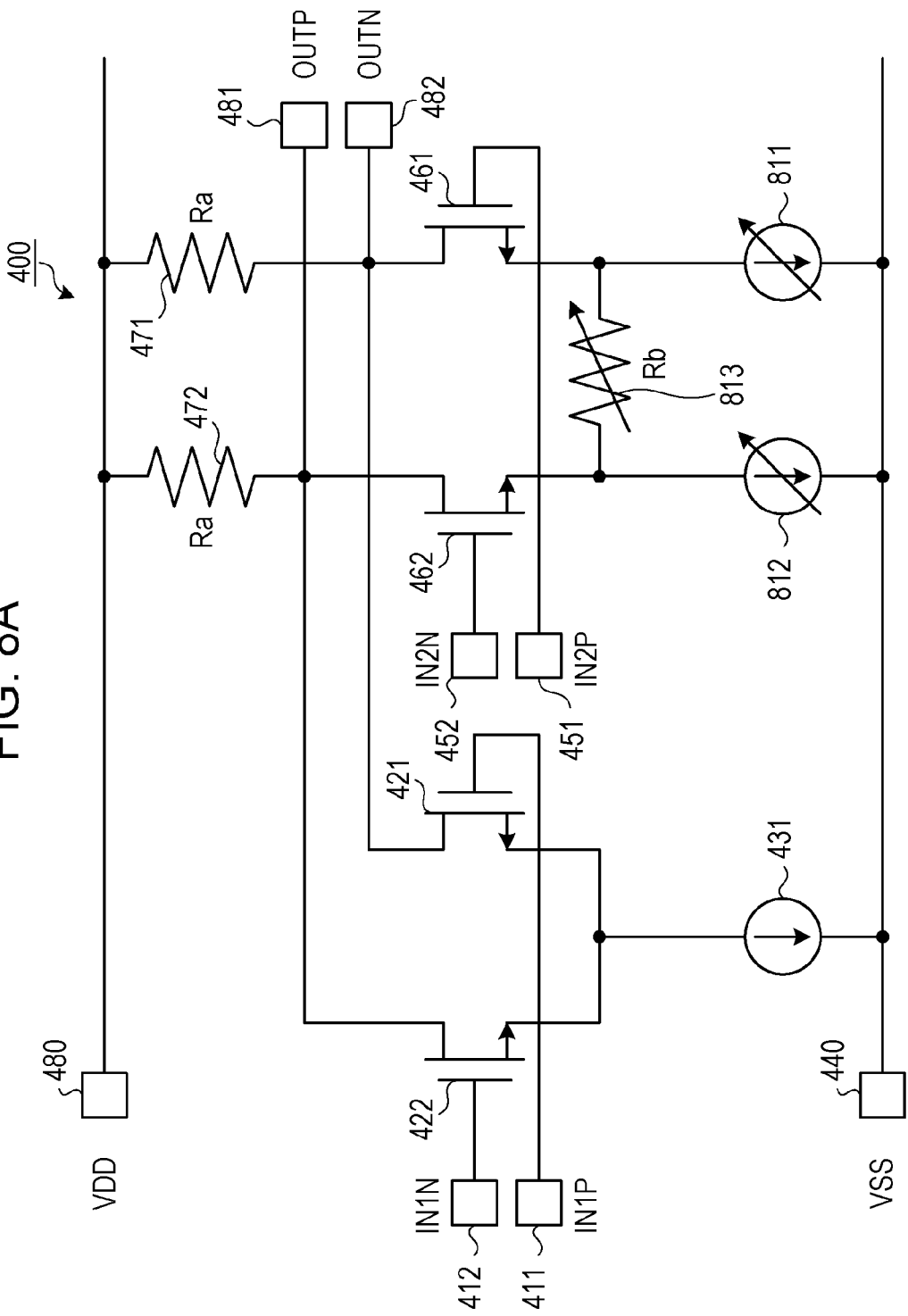
FIG. 8A illustrates an example of the configuration of an operational circuit illustrated in FIG. 7.

FIG. 8A illustrates an example of the configuration of the operational circuit 701 illustrated in FIG. 7. In FIG. 8A, parts that are the same as the parts illustrated in FIG. 4 are indicated by the same reference numerals and symbols, and a description thereof is omitted. As illustrated in FIG. 8A, the variable operational circuit 701 according to the second embodiment includes variable current sources 811 and 812 and a variable resistor 813 instead of the current source 432 illustrated in FIG. 4.

The variable current sources 811 and 812 are current sources that supply currents whose magnitude is variable. One of ends of the variable current source 811 is connected to the source of the transistor 461, while the other end of the variable current source 811 is connected to the ground 440. One of ends of the variable current source 812 is connected to the source of the transistor 462, while the other end of the variable current source 812 is connected to the ground 440. Thus, source currents of the transistors 461 and 462 may be variable. The variable resistor 813 has a variable resistance. One of ends of the variable resistor 813 is connected to the source of the transistor 461, while the other end of the variable resistor 813 is connected to the source of the transistor 462.

An emphasis gain (weight to be added to or subtracted from the feedback signal Data2) that is provided for emphasis by the operational circuit 400 can be represented by a value of $(Gm \times Ra)/(1+Gm \times Rb)$, where Gm is conductance of the transistors 461 and 462, Ra is resistances of the resistors 471 and 472, and Rb is a combined impedance (resistance of the variable resistor 813) of the sources of the transistors 461 and 462.

The emphasis gain depends on the combined impedance Rb of the sources of the transistors 461 and 462 of a differential circuit and the conductance Gm of the transistors 461 and 462. The conductance Gm depends on the source currents of the transistors 461 and 462. The emphasis gain may be adjusted by causing the variable current sources 811 and 812 to change the source currents of the transistors 461 and 462.

In addition, the emphasis gain may be adjusted by causing the variable resistor 813 to change the combined impedance Rb of the sources of the transistors 461 and 462. For example, when the resistance Rb of the variable resistor 813 is increased, the emphasis gain is reduced. When the resistance Rb of the variable resistor 813 is reduced, the emphasis gain increases.

Figure 8B:
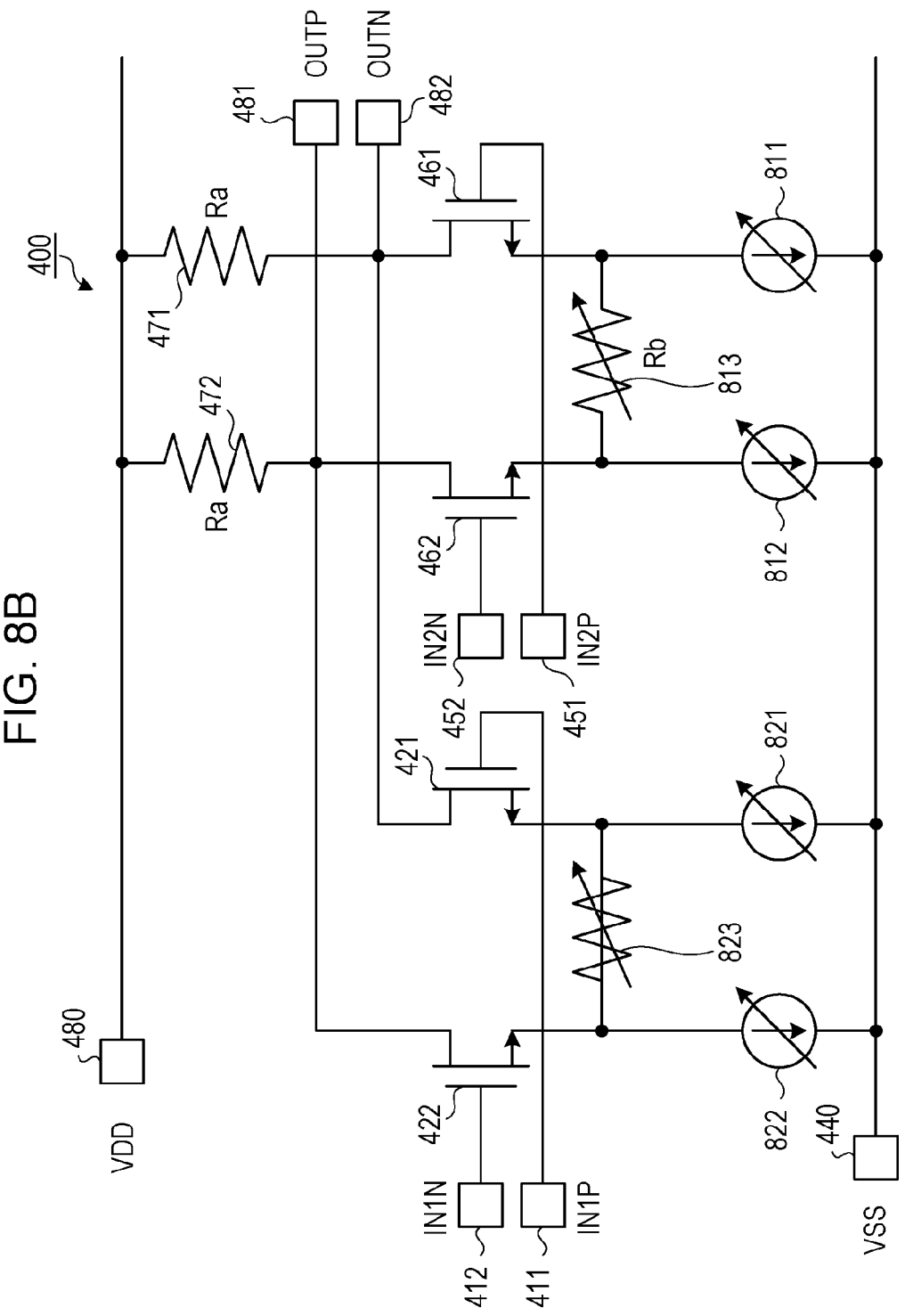
FIG. 8B illustrates a modified example of the operational circuit illustrated in FIG. 7.

FIG. 8B illustrate a modified example of the operational circuit 701 illustrated in FIG. 7. In FIG. 8B, parts that are the same as the parts illustrated in FIG. 8A are indicated by the same reference numerals and symbols, and a description thereof is omitted. As illustrated in FIG. 8B, the variable operational circuit 701 according to the second embodiment may include variable current sources 821 and 822 and a variable resistor 823 instead of the current source 431 illustrated in FIG. 8A.

The variable current sources 821 and 822 are current sources that supply currents whose magnitude is variable. One of ends of the variable current source 821 is connected to the source of the transistor 421, while the other end of the variable current source 821 is connected to the ground 440. One of ends of the variable current source 822 is connected to the source of the transistor 422, while the other end of the variable current source 822 is connected to the ground 440. Thus, source currents of the transistors 421 and 422 may be variable. The variable resistor 823 has a variable resistance. One of ends of the variable resistor 823 is connected to the source of the transistor 421, while the other end of the variable resistor 823 is connected to the source of the transistor 422.

Thus, the adjuster may adjust the weight to be added to or subtracted from the feedback signal Data2 and the weight to be added to or subtracted from the input signal Data1. The operational circuit 400 illustrated in FIG. 4 may include the variable current sources 821 and 822 and the variable resistor 823 instead of the current source 431. In this case, the adjuster may adjust the weight to be added to or subtracted from the input signal Data1. Thus, the variable operational circuit 701 according to the second embodiment is capable of adjusting at least one of the weight to be added to or subtracted from the input signal Data1 and the weight to be added to or subtracted from the feedback signal Data2.

First Modified Example of Signal Shaping Circuit

Figure 9:
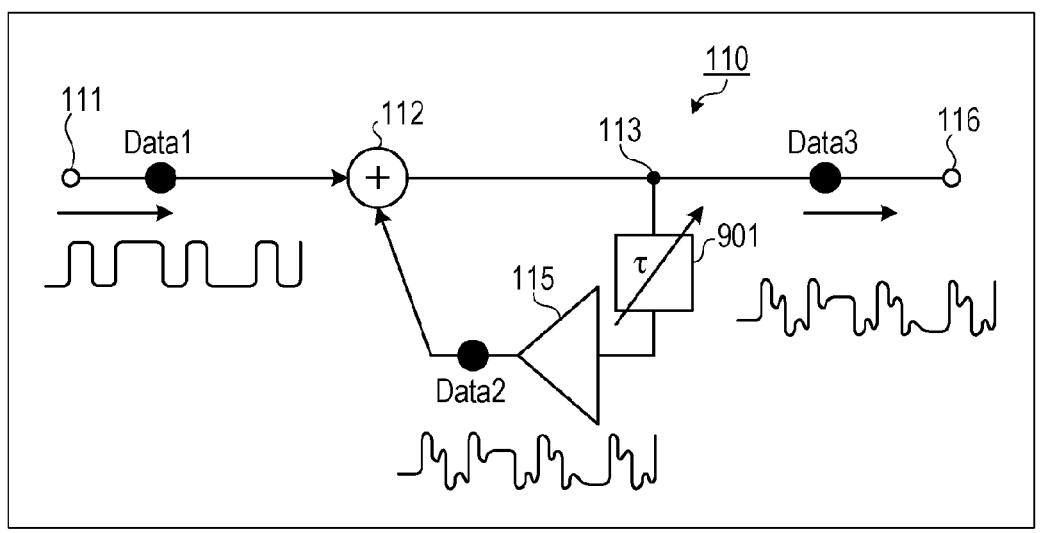
FIG. 9 illustrates a first modified example of the signal shaping circuit according to the second embodiment.

FIG. 9 illustrates a first modified example of the signal shaping circuit 110 according to the second embodiment. As illustrated in FIG. 9, the signal shaping circuit 110 according to the second embodiment may include a variable gain delay element 901 instead of the delay element 114 illustrated in FIG. 1A.

The variable gain delay element 901 is an operational circuit (refer to, for example, FIG. 10) formed by adding an adjuster to the delay element 114 illustrated in FIG. 1A, while the adjuster is capable of adjusting a gain to be provided to the feedback signal Data2. For example, the variable gain delay element 901 is a delay element that multiplies the feedback signal Data2 by a given ratio, delays the feedback signal Data2 and outputs the feedback signal Data2 and is capable of adjusting the given ratio. Instead of the buffer circuit 115, another buffer circuit may be provided, which has an adjuster that is capable of adjusting the gain to be provided to the feedback signal Data2.

Configurations of Delay Element and Buffer Circuit

Figure 10:
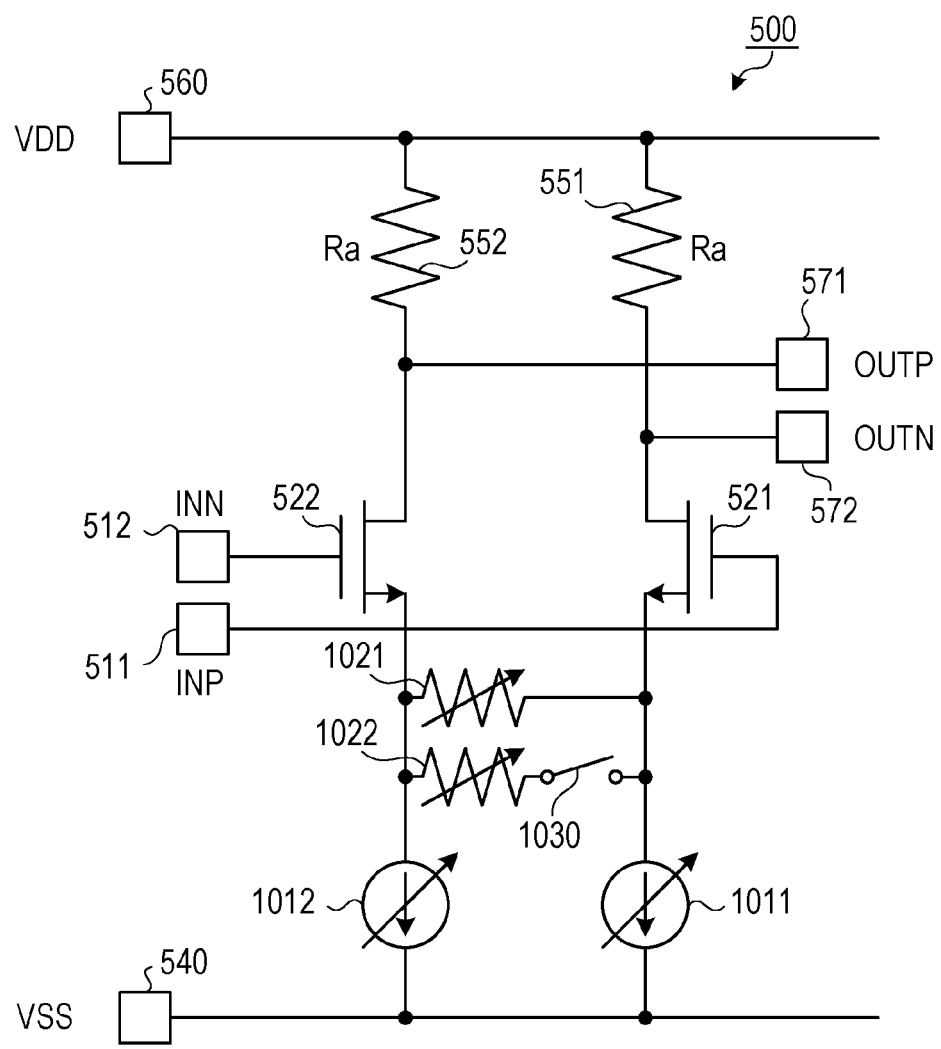
FIG. 10 illustrates an example of the configurations of a delay element and buffer circuit that are illustrated in FIG. 9.

FIG. 10 illustrates an example of the configurations of the delay element 901 and buffer circuit 115, which are illustrated in FIG. 9. In FIG. 10, parts that are the same as the parts illustrated in FIG. 5 are indicated by the same reference numerals and symbols, and a description thereof is omitted. The variable gain delay element 901 illustrated in FIG. 9 may be achieved by a delay buffer circuit 500 illustrated in FIG. 10. The delay buffer circuit 500 illustrated in FIG. 10 includes variable current sources 1011 and 1012, variable resistors 1021 and 1022 and a switch 1030 instead of the current source 530 illustrated in FIG. 5.

The variable current sources 1011 and 1012 are current sources that supply currents whose magnitude is variable. One of ends of the variable current source 1011 is connected to the source of the transistor 521, while the other end of the variable current source 1011 is connected to the ground 540. One of ends of the variable current source 1012 is connected to the source of the transistor 522, while the other end of the variable current source 1012 is connected to the ground 540.

The variable resistors 1021 and 1022 are resistors that have variable resistances. One of ends of the variable resistor 1021 is connected to the source of the transistor 521, while the other end of the variable resistor 1021 is connected to the source of the transistor 522. One of ends of the variable resistor 1022 is connected to the switch 1030, while the other end of the variable resistor 1022 is connected to the source of the transistor 522. When the switch 1030 is in an On state, the switch 1030 connects the variable resistor 1022 to the variable current source 1011. When the switch 1030 is in an Off state, the switch 1030 disconnects the variable resistor 1022 from the variable current source 1011.

A gain that is to be provided to the feedback signal Data2 by the delay buffer circuit 500 may be adjusted by causing the currents of the variable current sources 1011 and 1012 to be changed. In addition, the gain that is to be provided to the feedback signal Data2 by the delay buffer circuit 500 may be adjusted by switching between the On and Off states of the switch 1030.

The delay buffer circuit 500 may include a resistor with a fixed resistance instead of the variable resistors 1021 and 1022 and the switch 1030. In this case, the gain that is to be provided to the feedback signal Data2 by the delay buffer circuit 500 may be adjusted by causing the currents of the variable current sources 1011 and 1012 to be changed.

The delay buffer circuit 500 may include a current source that supplies a current whose magnitude is fixed, instead of the variable current sources 1011 and 1012. In this case, the gain that is to be provided to the feedback signal Data2 by the delay buffer circuit 500 may be adjusted by switching between the On and Off states of the switch 1030.

Input and Output Characteristics of Delay Buffer Circuit Before Adjustment

Figure 11A:
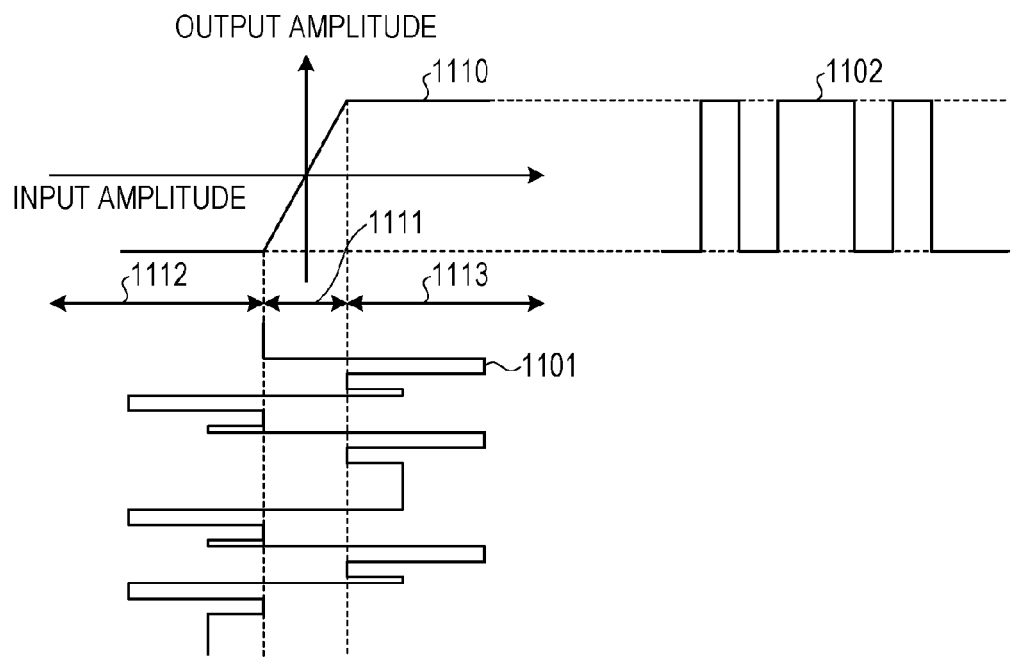
FIG. 11A illustrates an example of input and output characteristics of a delay buffer circuit illustrated in FIG. 10 before an adjustment.

FIG. 11A illustrates an example of input and output characteristics of the delay buffer circuit 500 illustrated in FIG. 10 before the adjustment. In FIG. 11A, the abscissa indicates the amplitude (input amplitude) of a signal 1101 input to the delay buffer circuit 500, while the ordinate indicates the amplitude (output amplitude) of a signal 1102 to be output from the delay buffer circuit 500. Input and output characteristics 1110 indicate characteristics of the amplitude of the signal 1102 to be output from the delay buffer circuit 500 with respect to the amplitude of the signal 1101 input to the delay buffer circuit 500.

The input and output characteristics 1110 have a linear region 1111 in which the output amplitude almost linearly increases with respect to an increase in the input amplitude. The input and output characteristics 1110 have nonlinear regions 1112 and 1113 on a low-amplitude side and high-amplitude side of the linear region 1111. The nonlinear regions 1112 and 1113 are regions in which the output amplitude is almost fixed with respect to an increase in the input amplitude. The delay buffer circuit 500 has an upper limit of the amplitude the signal to be output.

A gain (the amount of a change in the output amplitude with respect to the input amplitude) in the linear region 1111 is determined by the magnitude of the currents of the variable current sources 1011 and 1012 and the On or Off state of the switch 1030, for example. In the example illustrated in FIG. 11A, the gain in the linear region 1111 is set to a relatively large value. In this case, the width of the linear region 1111 is relatively small.

Thus, the amplitude of the input signal 1101 is not completely included in the linear region 1111. Thus, high-frequency components of the input signal 1101 appear in the nonlinear regions 1112 and 1113 and are limited and thereby not included in the signal 1102 to be output. Thus, when the linear region 1111 is narrow with respect to the amplitude of the input signal 1101, a high-frequency component of the signal 1102 (feedback signal Data2) to be output is lost, and the emphasis may not be sufficiently effective.

When the gain in the linear region 1111 is too small, the amplitude of the input signal 1101 is included in the linear region 1111, but the amplitude of the output signal 1102 is reduced. Thus, the ratio of the weight added to or subtracted from the feedback signal Data2 to the weight added to or subtracted from the input signal Data1 is reduced, for example. A sufficient degree of the emphasis, therefore, is not obtained. In addition, the intensity (amplitude) of the output signal Data3 may not be sufficient.

The delay buffer circuit 500 is described with reference to FIG. 11A. The operational circuit 400 has an upper limit of the amplitudes of the signals to be output in a similar manner to the delay buffer circuit 500. In the operational circuit 400, when the amplitude of the feedback signal Data2 is not completely included in the linear region 1111, a sufficient degree of the emphasis may not be obtained, or the intensity (amplitude) of the output signal Data3 may not be sufficiently high.

Since an IIR filter that is used as a band pass filter in a conventional wireless communication device is used as a filter, the IIR filter does not adjust the degree of emphasis and the intensity of an output signal. Thus, for the conventional IIR filter, it is sufficient if an operational circuit and a delay element are designed so that the amplitudes of signals are included in a linear region of input and output characteristics. There is, therefore, no problem that the aforementioned signal is not completely included in the linear region.

Figure 11B:
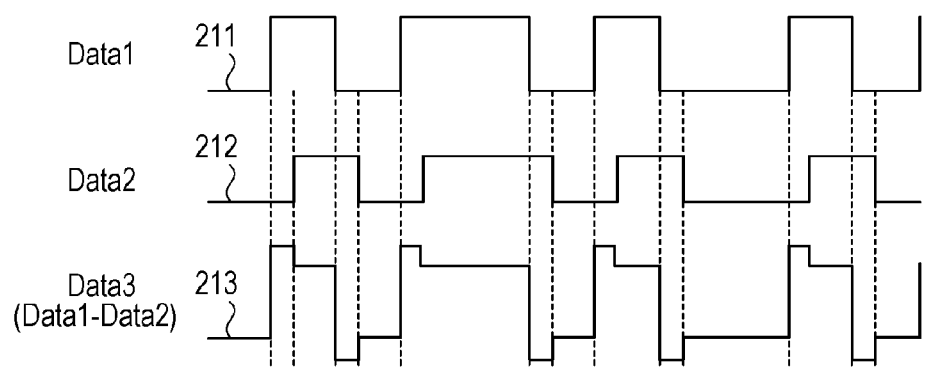
FIG. 11B illustrates an example of signals of the delay buffer circuit illustrated in FIG. 10 before the adjustment.

Signals of Delay Buffer Circuit Before Adjustment FIG. 11B illustrates an example of signals of the delay buffer circuit 500 illustrated in FIG. 10 before the adjustment. In FIG. 11B, parts that are the same as the parts illustrated in FIG. 2 are indicated by the same reference numerals and symbols, and a description thereof is omitted. When the amplitude of the input signal 1101 is not completely included in the linear region 1111 as illustrated in FIG. 11A, high-frequency components of the signal 1102 (feedback signal Data2) to be output are lost as indicated by the waveform 212 illustrated in FIG. 11B. Thus, the emphasis may not be sufficiently effective for the output signal Data3 as illustrated by the waveform 213 illustrated in FIG. 11B.

When the IIR filter is used for the emphasis, a high-frequency component may be lost by limiting output of the operational circuit 112, output of the delay element 114, output of the buffer circuit 115 or the like during a process of delaying an emphasis signal and returning the emphasis signal. As a result, an emphasis signal (for example, the waveform 213 illustrated in FIG. 2) that has a steep component of a specific frequency and is specific to the IIR method may not be obtained. On the other hand, the signal shaping circuit 500 according to the second embodiment makes variable gains provided by the operational circuit 400 and the delay buffer circuit 500.

Input and Output Characteristics of Delay Buffer Circuit after Adjustment

Figure 12A:
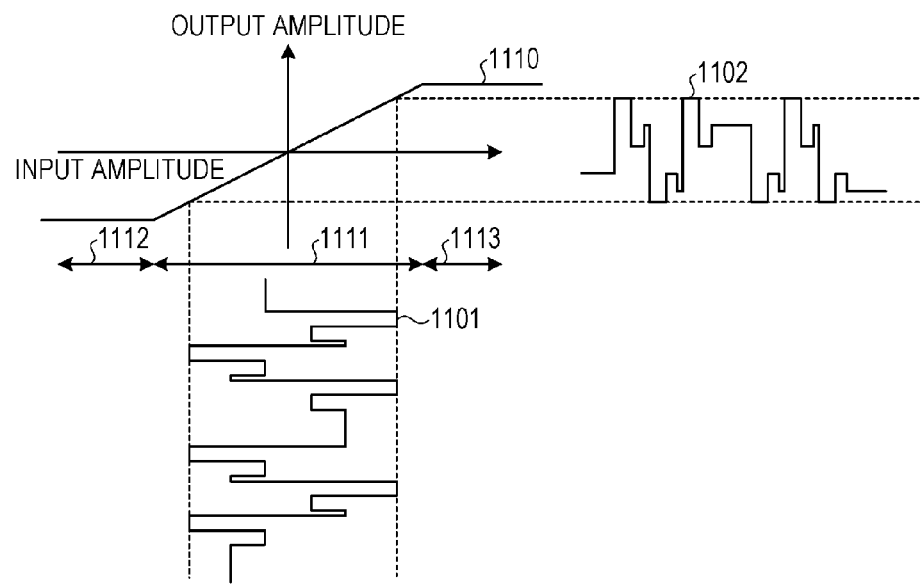
FIG. 12A illustrates an example of input and output characteristics of the delay buffer circuit illustrated in FIG. 10 after the adjustment.

FIG. 12A illustrates an example of input and output characteristics of the delay buffer circuit 500 illustrated in FIG. 10 after the adjustment. In FIG. 12A, parts that are the same as the parts illustrated in FIG. 11A are indicated by the same reference numerals, and a description thereof is omitted. The delay buffer circuit 500 according to the second embodiment may adjust the gain in the linear region 1111 on the basis of the magnitude of the currents of the variable current sources 1011 and 1012 and the state of the switch 1030.

In the example illustrated in FIG. 12A, the gain in the linear region 1111 is set to be smaller than the gain in the linear region 1111 illustrated in FIG. 11A. In this case, the width of the linear region 1111 is relatively large. Thus, the amplitude of the input signal 1101 is included in the linear region 1111. The high-frequency components of the input signal 1101 are included in the linear region 1111 and therefore are not limited. As a result, the high-frequency components are included in the signal 1102 to be output.

As described above, when the amplitude of the input signal 1101 is adjusted on the basis of the magnitude of the currents of the variable current sources 1011 and 1012 and the state of the switch 1030 so that the amplitude of the input signal 1101 is included in the linear region 1111, the high-frequency components of the signal 1102 (feedback signal Data2) to be output are maintained. Thus, the signal is strongly emphasized. For example, the signal may be efficiently emphasized by adjusting the amplitude of the input signal 1101 to approximately 90% of the linear region 1111.

When the gain in the linear region 1111 is adjusted on the basis of the magnitude of the currents of the variable current sources 1011 and 1012 and the state of the switch 1030 so that the gain in the linear region 1111 is not to be small, this gain inhibits the amplitude of the output signal 1102 from being too small. Thus, the fact that a sufficient degree of the emphasis is not obtained is avoided. In addition, the fact that the intensity (amplitude) of the signal is not sufficiently increased is avoided.

Signals of Delay Buffer Circuit after Adjustment

Figure 12B:
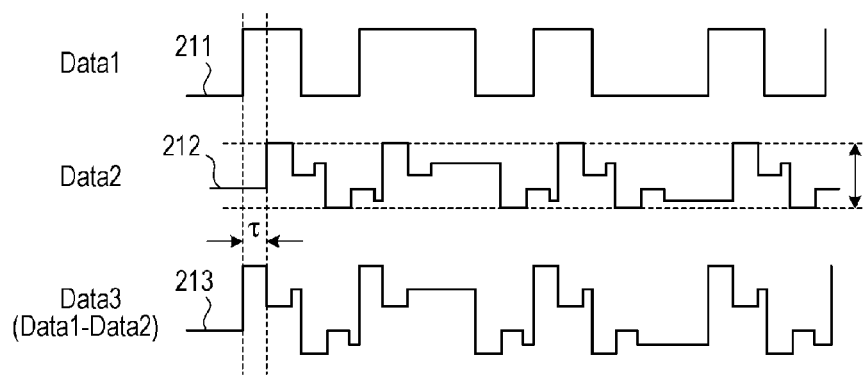
FIG. 12B illustrates an example of signals of the delay buffer circuit illustrated in FIG. 10 after the adjustment.

FIG. 12B illustrate an example of signals of the delay buffer circuit 500 illustrated in FIG. 10 after the adjustment. In FIG. 12B, parts that are the same as the parts illustrated in FIG. 2 are indicated by the same reference numerals and symbols, and a description thereof is omitted. When the amplitude of the input signal 1101 is included in the linear region 1111 as illustrated in FIG. 12A, the high-frequency components of the signal 1102 (feedback signal Data2) to be output are maintained as indicated by the waveform 212 illustrated in FIG. 12B. Thus, the output signal Data3 is strongly emphasized as indicated by the waveform 213 illustrated in FIG. 12B.

Second Modified Example of Signal Shaping Circuit

Figure 13:
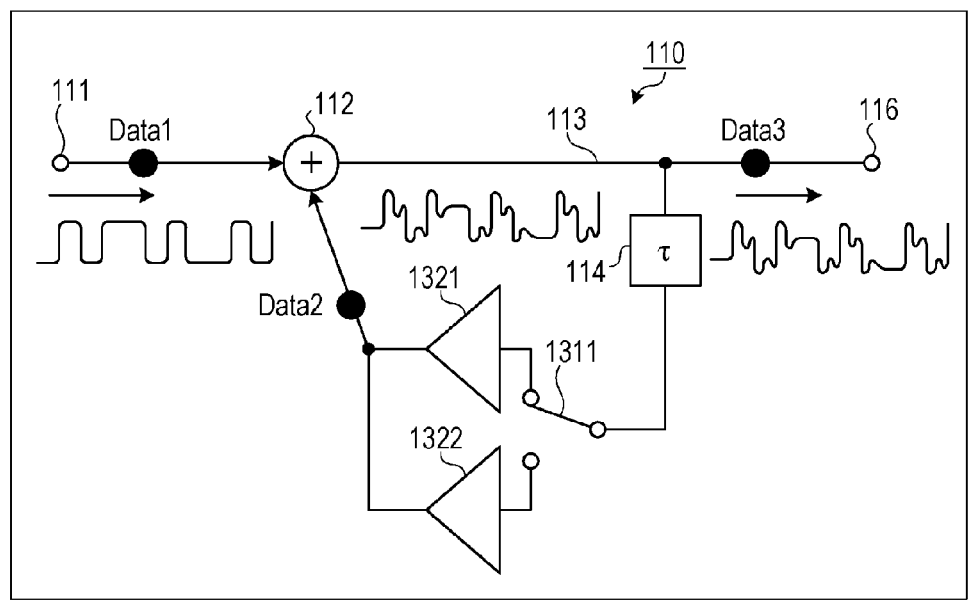
FIG. 13 illustrates a second modified example of the signal shaping circuit according to the second embodiment.

FIG. 13 illustrates a second modified example of the signal shaping circuit 110 according to the second embodiment. In FIG. 13, parts that are the same as the parts illustrated in FIG. 1A are indicated by the same reference numerals and symbols, and a description thereof is omitted. As illustrated in FIG. 13, the signal shaping circuit 110 according to the second embodiment may include a switch 1311 and buffer circuits 1321 and 1322 instead of the buffer circuit 115 illustrated in FIG. 1A.

The delay element 114 outputs a delayed signal to the switch 1311. The switch 1311 is a path switch that switches between first and second states. In the first state, the switch 1311 causes the signal output from the delay element 114 to be input to the buffer circuit 1321. In the second state, the switch 1311 causes the signal output from the delay element 114 to be input to the buffer circuit 1322.

Each of the buffer circuits 1321 and 1322 controls output of the signal output from the switch 1311 and outputs the signal to the operational circuit 112. The buffer circuits 1321 and 1322 use different gains to amplify the signal. The configurations of the buffer circuits 1321 and 1322 are the same as the delay buffer circuit 500 illustrated in FIG. 5, for example. Thus, the output of the feedback signal Data2 from the switch 1311 may be changed by the switching performed by the switch 1311.

Results of Simulation of Signals Before Adjustment

FIG. 14A illustrates results of simulation of the feedback signal before an adjustment. FIG. 14B illustrates results of simulation of the output signal before the adjustment. In each of FIGS. 14A and 14B, the abscissa indicates time (nanoseconds), while the ordinate indicates the intensity of the interested signal.

A waveform 1411 illustrated in FIG. 14A is a waveform of the feedback signal Data2 before the adjustment of the gain provided by the variable operational circuit 701 or the gain provided by the variable gain delay element 901. A waveform 1412 illustrated in FIG. 14B is a waveform of the output signal Data3 before the adjustment of the gain provided by the variable operational circuit 701 or the gain provided by the variable gain delay element 901. As is apparent from the waveforms 1411 and 1412, the intensities of high-frequency components of the feedback signal Data2 and output signal Data3 are low before the adjustment of the gain provided by the variable operational circuit 701 or the gain provided by the variable gain delay element 901.

Figure 15A:
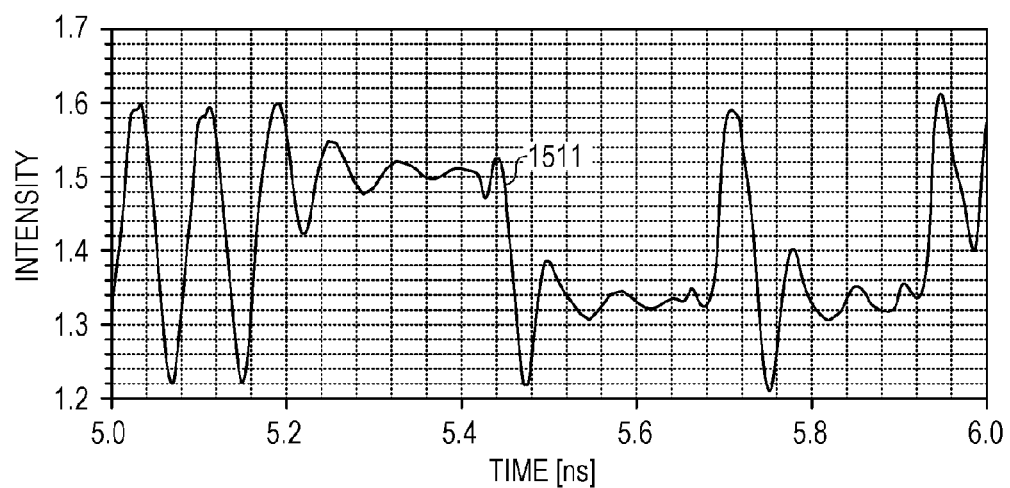
FIG. 15A illustrates an example of results of simulation of the feedback signal after the adjustment.
Figure 15B:
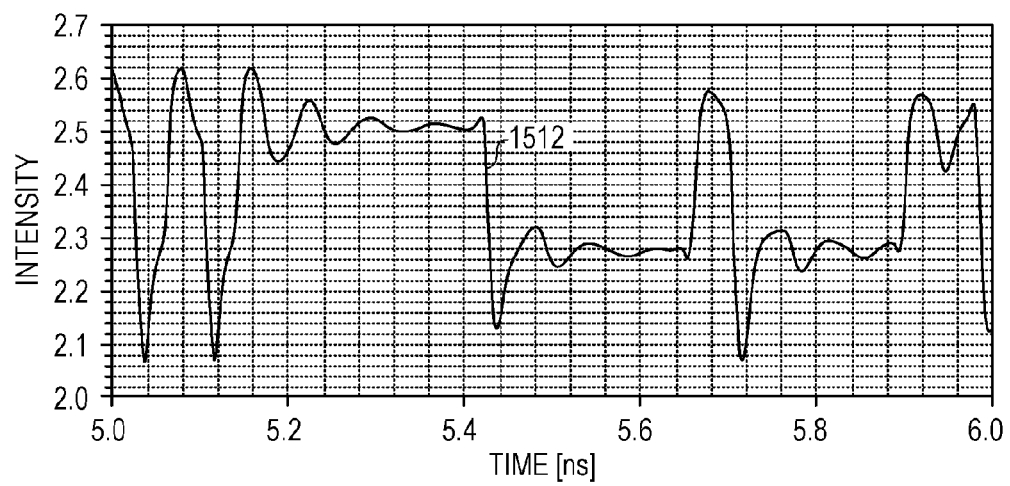
FIG. 15B illustrates an example of results of simulation of the output signal after the adjustment.

Results of Simulation of Signals after Adjustment FIG. 15A illustrates an example of results of simulation of the feedback signal Data2 after the adjustment. FIG. 15B illustrates an example of results of simulation of the output signal Data3 after the adjustment. In each of FIGS. 15A and 15B, the abscissa indicates time (nanoseconds), while the ordinate indicates the intensity of the interested signal.

A waveform 1511 illustrated in FIG. 15A is a waveform of the feedback signal Data2 after the adjustment of the gain provided by the variable operational circuit 701 or the gain provided by the variable gain delay element 901. A waveform 1512 illustrated in FIG. 15B is a waveform of the output signal Data3 after the adjustment of the gain provided by the variable operational circuit 701 or the gain provided by the variable gain delay element 901. As is apparent from the waveforms 1511 and 1512, the intensities of the high-frequency components of the feedback signal Data2 and output signal Data3 are increased after the adjustment of the gain provided by the variable operational circuit 701 or the gain provided by the variable gain delay element 901 so that the high-frequency components are strongly emphasized.

In the signal shaping circuit 110 according to the second embodiment, the gain to be provided by the adder or the like of the IIR filter is adjusted, and whereby attenuation of high-frequency components limited by the adder or the like is suppressed. Thus, a requested degree of the emphasis and a requested intensity of the signal are achieved. The signal shaping circuit 110 according to the second embodiment, therefore, flexibly shapes the signal.

Third Embodiment

Parts that are different from the first and second embodiments are described in the third embodiment.

Configuration of Signal Shaping Circuit

Figure 16:
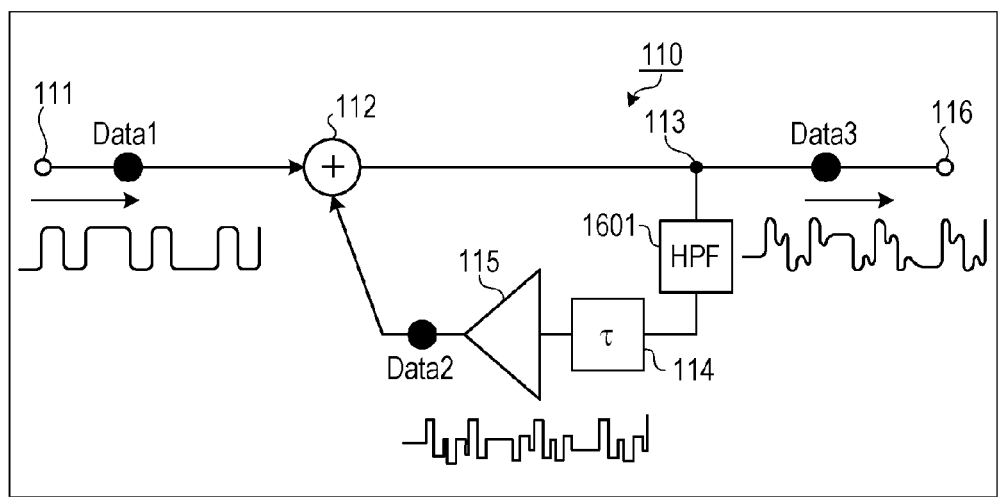
FIG. 16 illustrates an example of the configuration of a signal shaping circuit according to a third embodiment.

FIG. 16 illustrates an example of the configuration of a signal shaping circuit 110 according to the third embodiment. In FIG. 16, parts that are the same as the parts illustrated in FIG. 1A are indicated by the same reference numerals and symbols, and a description thereof is omitted. As illustrated in FIG. 16, the signal shaping circuit 110 according to the third embodiment has the configuration illustrated in FIG. 1A and includes a high pass filter (HPF) 1601. The high pass filter 1601 is arranged between the divider 113 and the delay element 114, for example.

The high pass filter 1601 is a filter that attenuates low-frequency components that are included in the feedback signal Data2 output from the divider 113 and have frequencies that are equal to or lower than a predetermined frequency. The high pass filter 1601 outputs the feedback signal Data2 with the attenuated low-frequency components to the delay element 114. The delay element 114 delays the feedback signal Data2 output from the high pass filter 1601.

In the example illustrated in FIG. 16, the high pass filter 1601 is arranged between the divider 113 and the delay element 114. The high pass filter 1601, however, may be arranged between the delay element 114 and the buffer circuit 115. In addition, the high pass filter 1601 may be arranged between the buffer circuit 115 and the operational circuit 112.

Configuration of High Pass Filter

Figure 17:
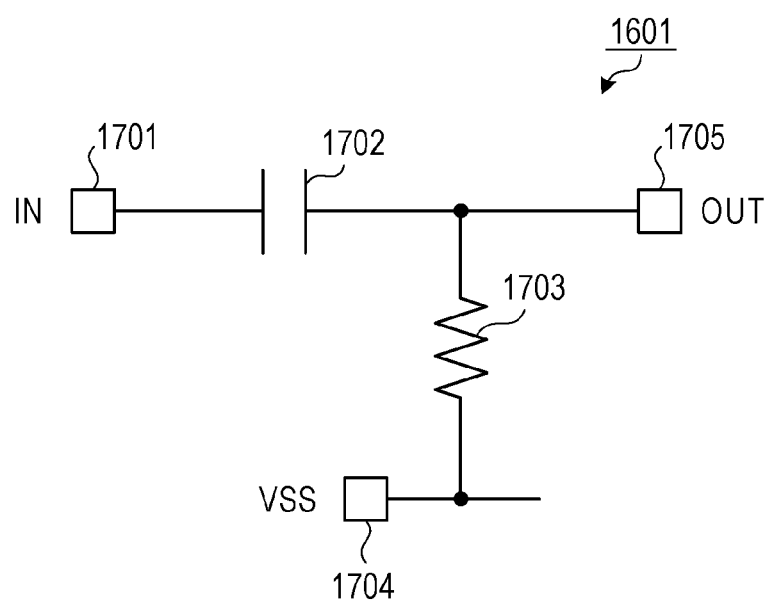
FIG. 17 illustrates an example of the configuration of a high pass filter illustrated in FIG. 16.

FIG. 17 illustrates an example of the configuration of the high pass filter 1601 illustrated in FIG. 16. As illustrated in FIG. 17, the high pass filter 1601 includes an input element 1701, a capacitor 1702, a resistor 1703, a ground 1704 and an output element 1705, for example. The output signal Data3 that is output from the divider 113 is input to the input element 1701.

As described above, the feedback signal Data 2 that is input to the high pass filter 1601 is input to the input element 1701 (IN). One of ends of the capacitor 1702 is connected to the input element 1701, while the other end of the capacitor 1702 is connected to the resistor 1703 and the output element 1705. One of ends of the resistor 1703 is connected to the output element 1705, while the other end of the resistor 1703 is connected to the ground 1704 (VSS).

The output element 1705 (OUT) outputs the input feedback signal Data2 to the delay element 114 located on the downstream side of the high pass filter 1601. Thus, the high pass filter 1601 attenuates the low-frequency components included in the feedback signal Data2 and outputs the feedback signal Data2 with the attenuated low-frequency components.

Input and Output Characteristics of Delay Buffer Circuit

Figure 18:
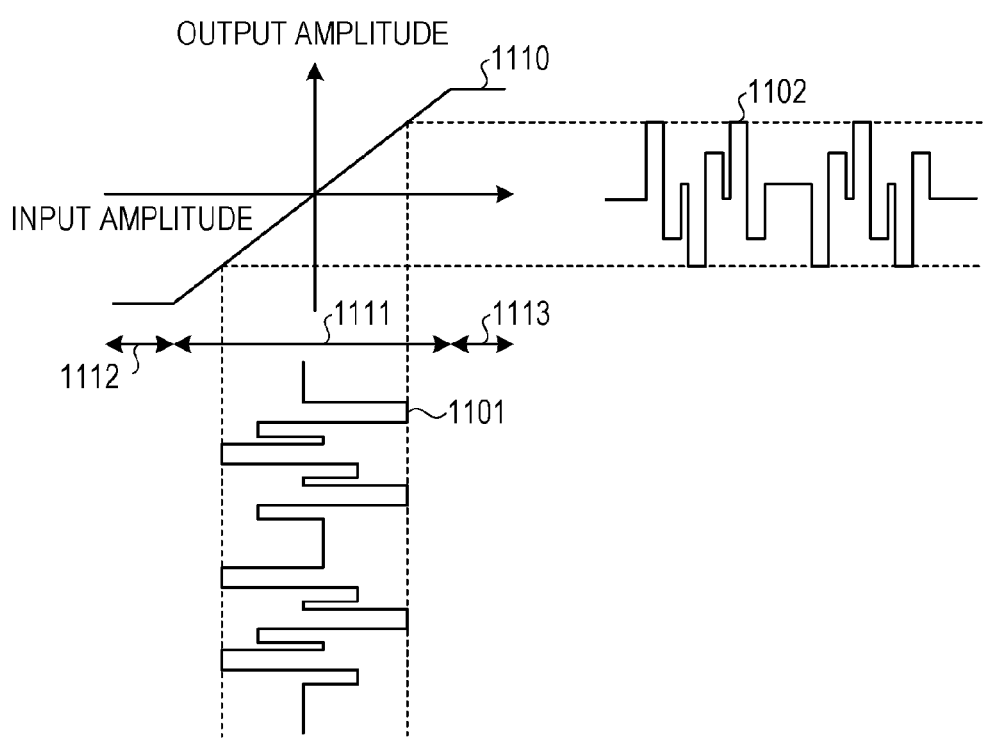
FIG. 18 illustrates an example of input and output characteristics of a delay buffer circuit when a signal that has passed through the high pass filter illustrated in FIG. 16 is input to the delay buffer circuit.

FIG. 18 illustrates an example of input and output characteristics of the delay buffer circuit 500 when the feedback signal Data2 that has passed through the high pass filter 1601 illustrated in FIG. 16 is input to the delay buffer circuit 500. In FIG. 18, parts that are the same as the parts illustrated in FIG. 11A are indicated by the same reference numerals, and a description thereof is omitted. The amplitude of the feedback signal Data2 is reduced by causing the high pass filter 1601 to attenuate the low-frequency components of the feedback signal Data2 as illustrated in FIG. 16.

Thus, the high-frequency components of the input signal 1101 (feedback signal Data2) are easily included in the linear region 1111 as illustrated in FIG. 18. The gain in the linear region 1111 is increased while the high-frequency components of the input signal 1101 are included in the linear region 1111.

When the high pass filter 1601 is arranged, the amplitude dependency of the input signal 1101 and the amplitude dependency of the output signal 1102 are reduced by assigning an emphasis signal with an emphasized high-frequency component to the linear region 1111 that has high linearity. Thus, the emphasized high-frequency component may be efficiently delayed and returned to the operational circuit 112.

Results of Simulation of Feedback Signal after Adjustment

Figure 19:
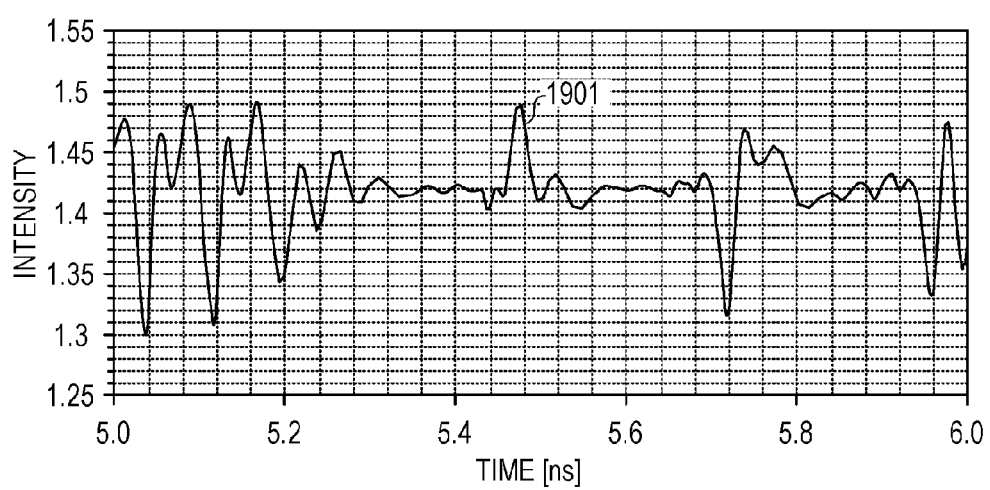
FIG. 19 illustrates an example of results of simulation of a feedback signal after an adjustment.
Figure 20:
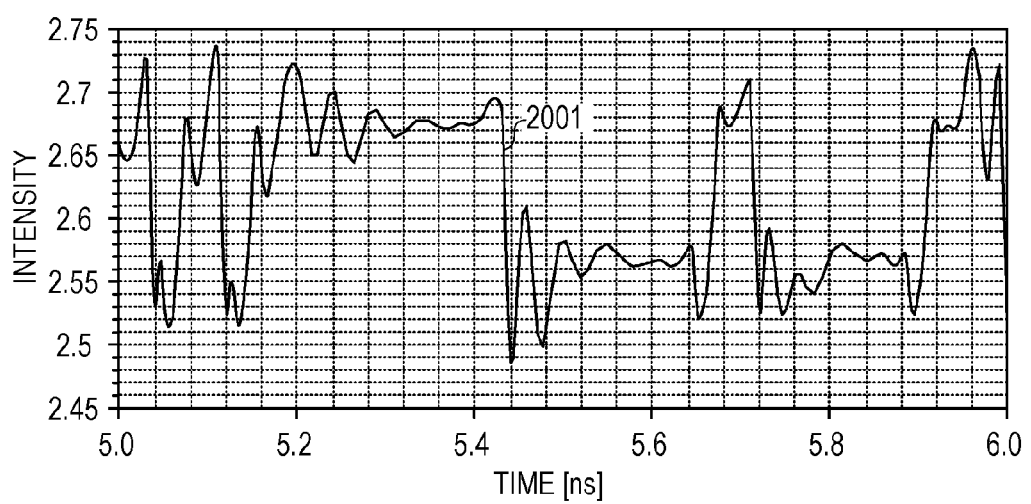
FIG. 20 illustrates an example of results of simulation of an output signal after the adjustment.

FIG. 19 illustrates an example of results of simulation of the feedback signal Data2 after the adjustment. FIG. 20 illustrates an example of results of simulation of the output signal Data3 after the adjustment. In each of FIGS. 19 and 20, the abscissa indicates time (nanoseconds), and the ordinate indicates the intensity of the interested signal.

A waveform 1901 illustrated in FIG. 19 is a waveform of the feedback signal Data2 after the adjustment of the gain provided by the variable operational circuit 701 or the gain provided by the variable gain delay element 901. A waveform 2001 illustrated in FIG. 20 is a waveform of the output signal Data3 after the adjustment of the gain provided by the variable operational circuit 701 or the gain provided by the variable gain delay element 901. As is apparent from the waveforms 1901 and 2001, the intensities of high-frequency components of the feedback signal Data2 and output signal Data3 are higher than the examples illustrated in FIGS. 15A and 15B, and whereby the high-frequency components of the feedback signal Data2 are more strongly emphasized than the examples illustrated in FIGS. 15A and 15B.

In the signal shaping circuit 110 according to the third embodiment, the high pass filter 1601 that attenuates low-frequency components of the feedback signal Data2 reduces the amplitude of the feedback signal Data2. Thus, the amplitude of the feedback signal Data2 is easily included in a linear region of input and output characteristics of an adding circuit or the like. The signal shaping circuit 110 according to the third embodiment, therefore, more flexibly shapes the signal.

The signal shaping circuit 110 according to the third embodiment may adjust a gain and the like provided by the operational circuit 112, the delay element 114, the buffer circuit 115 and the like while the operational circuit 112, the delay element 114, the buffer circuit 115 are included in the IIR filter. Thus, a requested degree of emphasis and a requested intensity of the signal are easily achieved, while attenuation of high-frequency components limited by the adder or the like is suppressed.

Fourth Embodiment

Parts that are different from the first to third embodiment are described in the fourth embodiment.

Figure 21A:
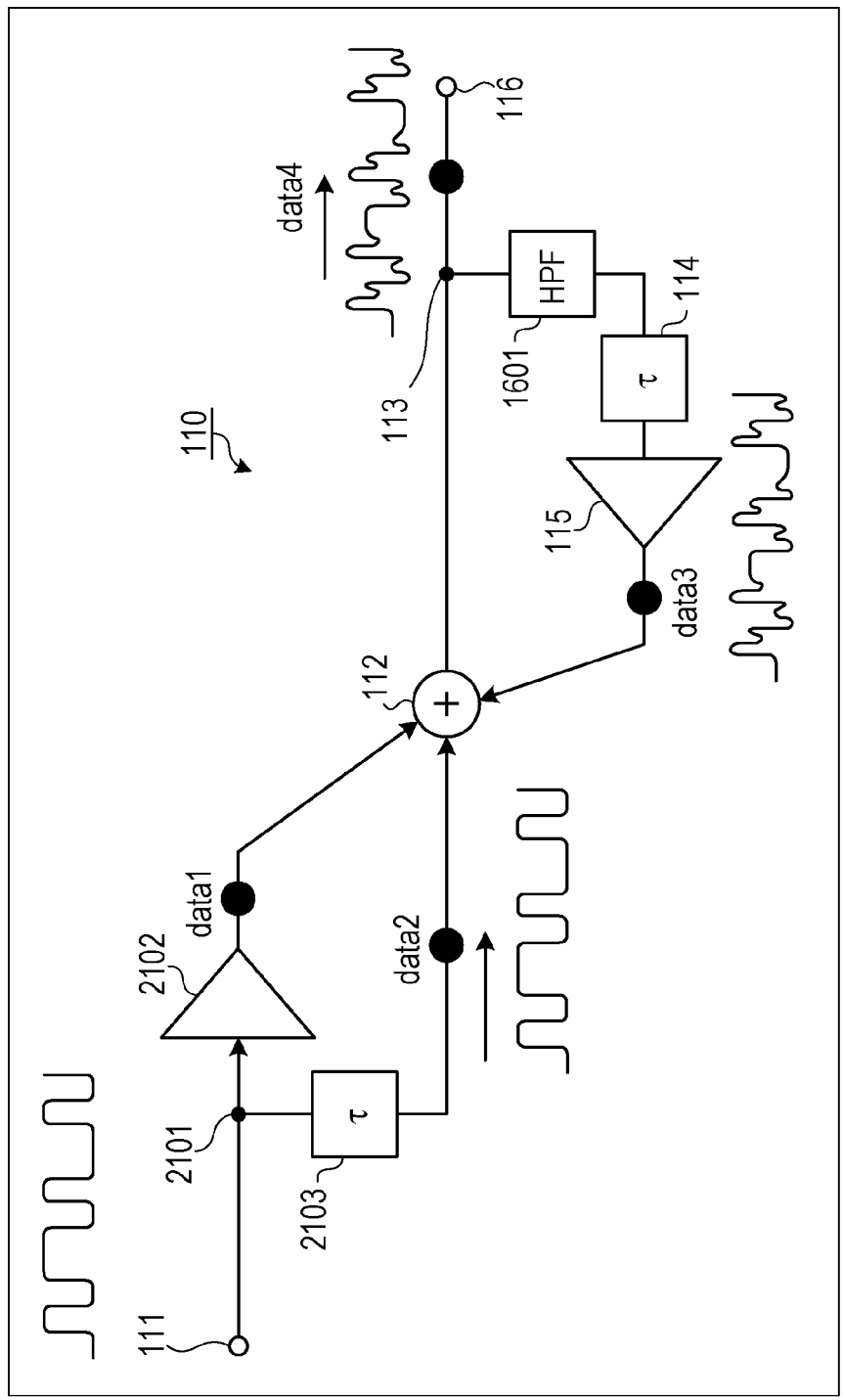
FIG. 21A illustrates an example of the configuration of a signal shaping circuit according to a fourth embodiment.

FIG. 21A illustrates an example of the configuration of a signal shaping circuit 110 according to the fourth embodiment. In FIG. 21A, parts that are the same as the parts illustrated in FIG. 16 are indicated by the reference numerals and symbols, and a description thereof is omitted. As illustrated in FIG. 21A, the signal shaping circuit 110 according to the fourth embodiment has the configuration illustrated in FIG. 16 and includes a divider 2101, a buffer circuit 2102 and a delay element 2103. The divider 2101, the buffer circuit 2102, the delay element 2103 and the operational circuit 112 form an FIR filter.

In the signal shaping circuit 110 according to the fourth embodiment, the FIR filter is arranged on the upstream side of the IIR type signal shaping circuit. For example, the divider 2101, the buffer circuit 2102 and the delay element 2103 form a dividing delay circuit that divides an input signal into signals, provides the difference between delay times of the divided signals, and causes the divided signals delayed by the different delay times to be input to the first input element.

The divider 2101 divides a signal output from the input element 111 into signals. The divider 2101 outputs one of the divided signals as a divided signal data1 to the buffer circuit 2102 and outputs the other of the divided signals as a divided signal data2 to the delay element 2103.

The buffer circuit 2102 controls output of the divided signal data1 output from the divider 2101. The buffer circuit 2102 outputs the controlled divided signal data1 to the operational circuit 112. The delay element 2103 delays the divided signal data2 output from the divider 2101. The delay element 2103 outputs the delayed divided signal data2 to the operational circuit 112.

The operational circuit 112 adds or subtracts a feedback signal data3 output from the buffer circuit 115 to or from the divided signal data1 output from the buffer circuit 2102 and the divided signal data2 output from the delay element 2103. The operational circuit 112 outputs signals obtained by adding or subtracting the feedback signal data3 to or from the divided signals data1 and data2 as an output signal data4 to the divider 113.

The divider 113 divides the signal data4 output from the operational circuit 114 into signals. The divider 113 outputs one of the divided signals to the output element 116 and outputs the other of the divided signal as a feedback signal data3 to the high pass filter 1601. The high pass filter 1601 attenuates a low-frequency component of the feedback signal data3 output from the divider 113 and outputs the feedback signal data3 with the attenuated low-frequency component to the delay element 114.

The delay element 114 delays the feedback signal data3 output from the high pass filter 1601 and outputs the feedback signal data3 to the buffer circuit 115. The buffer circuit 115 controls output of the feedback signal data3 output from the delay element 114 and outputs the controlled feedback signal data3 to the operational circuit 112.

Configuration of Signal Shaping Circuit without High Pass Filter

Figure 21B:
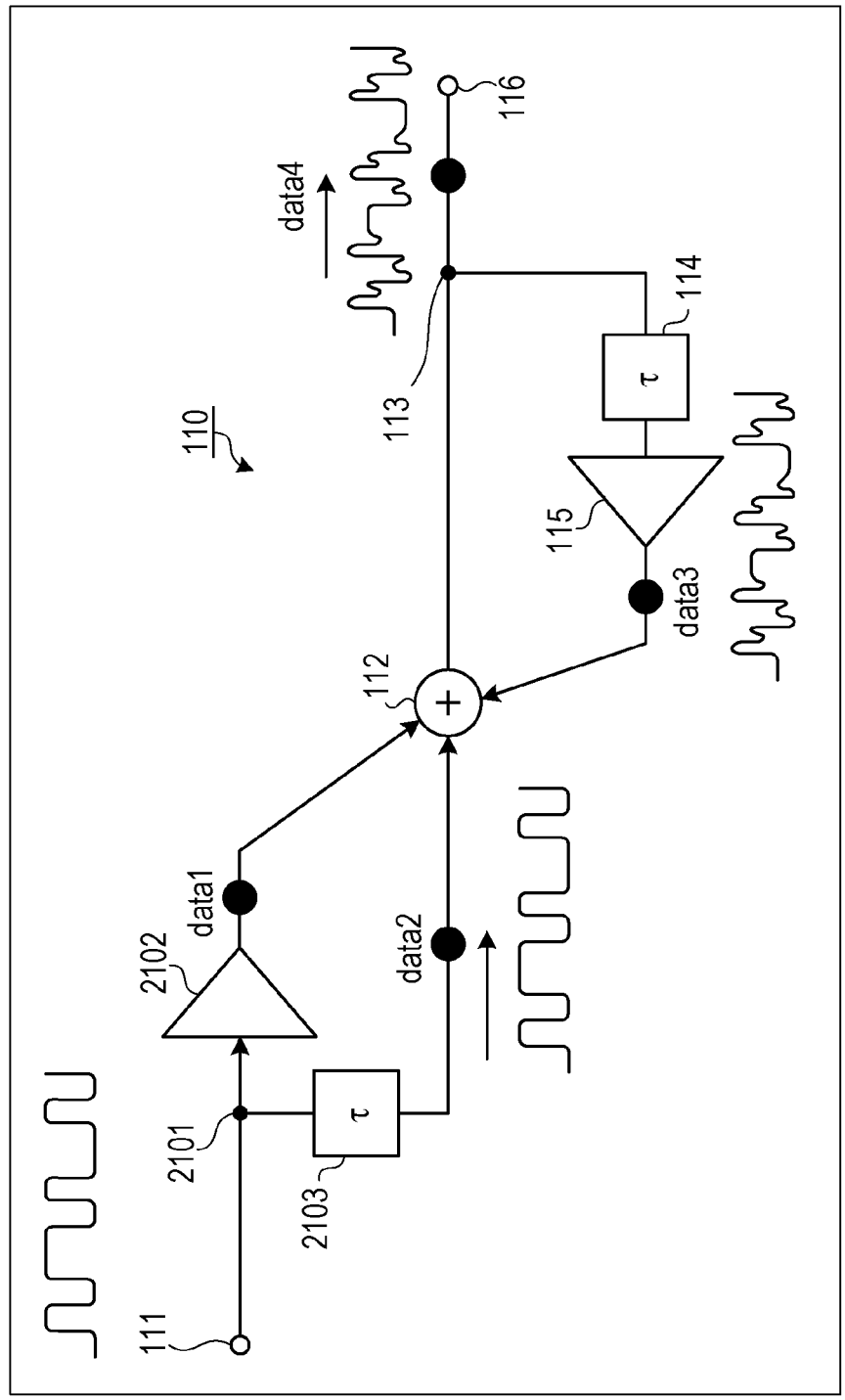
FIG. 21B illustrates a configuration of the signal shaping circuit that is illustrated in FIG. 21A and from which the high pass filter is removed.

FIG. 21B illustrates, as a reference, the configuration of the signal shaping circuit 110 (illustrated in FIG. 21A) from which the high pass filter 1601 is removed. The signal shaping circuit 110 that is illustrated in FIG. 21B as a reference is configured by removing the high pass filter 1601 from the signal shaping circuit 110 illustrated in FIG. 21A.

Figure 22A:
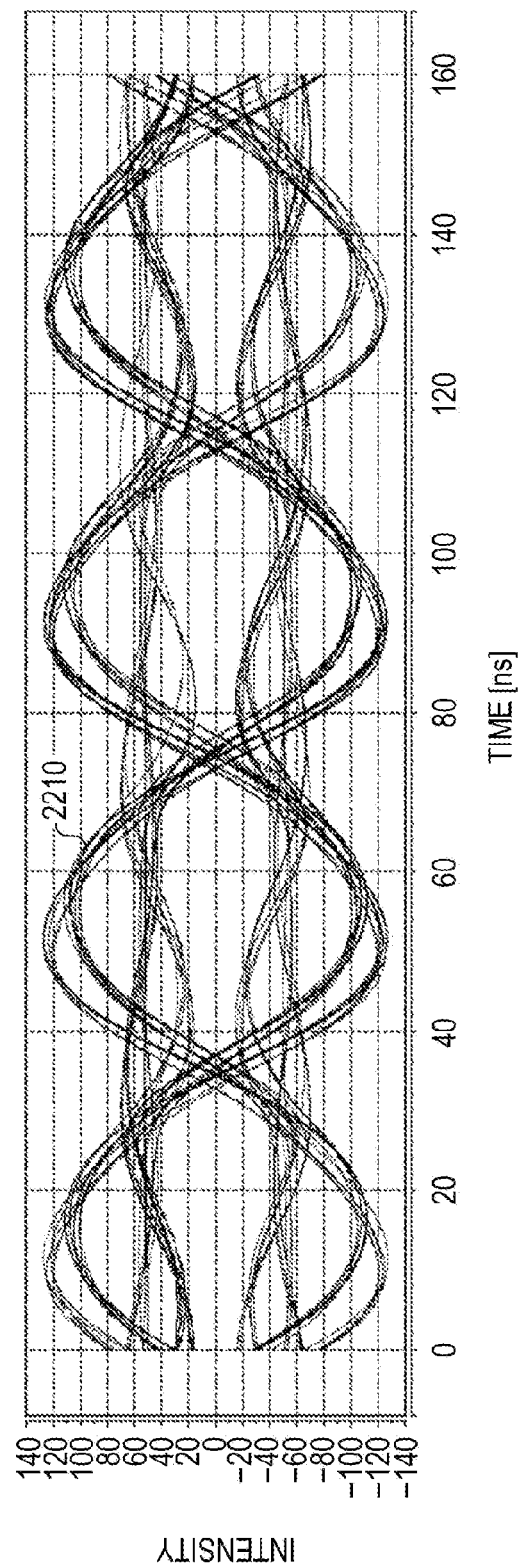
FIG. 22A illustrates an example of an eye pattern of a signal output from the signal shaping circuit illustrated in FIG. 1A.
Figure 22B:
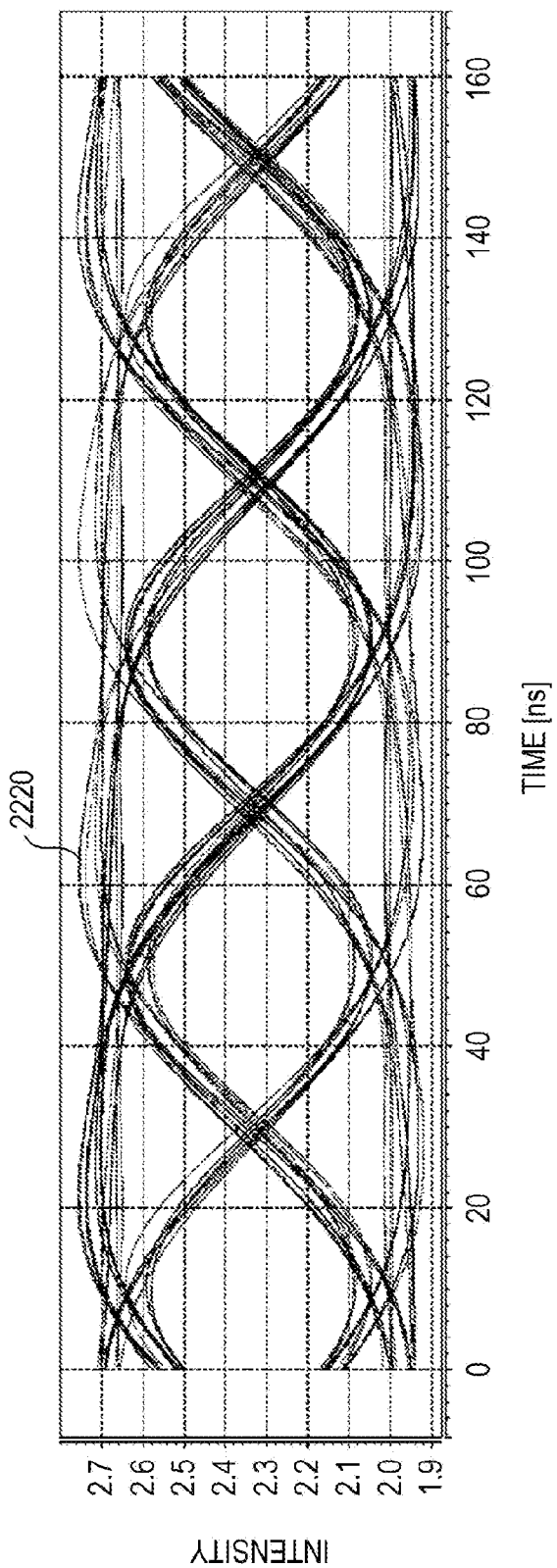
FIG. 22B illustrates an example of an eye pattern of light output from a light outputting element driven by the signal output from the signal shaping circuit illustrated in FIG. 1A.

Phase Characteristics of IIR Type Signal Shaping Circuit without High Pass Filter FIG. 22A illustrates an example of an eye pattern of the signal output from the signal shaping circuit 110 illustrated in FIG. 1A. FIG. 22B illustrates an example of an eye pattern of light output from the light outputting element 610 driven by the signal output from the signal shaping circuit illustrated in FIG. 1A. In each of FIGS. 22A and 22B, the abscissa indicates time (nanoseconds), and the ordinate indicates the intensity of the interested signal (the same applies to the following eye patterns).

An eye pattern 2210 illustrated in FIG. 22A is an eye pattern of the signal Data3 output from the (IIR type) signal shaping circuit 110 (without the high pass filter 1601) illustrated in FIG. 1A. An eye pattern 2220 illustrated in FIG. 22B is an eye pattern of the light output from the light outputting element 610 driven by the signal output from the (IIR type) signal shaping circuit 110 (without the high pass filter 1601) illustrated in FIG. 1A.

Phase Characteristics of IIR Type Signal Shaping Circuit with High Pass Filter

Figure 23A:
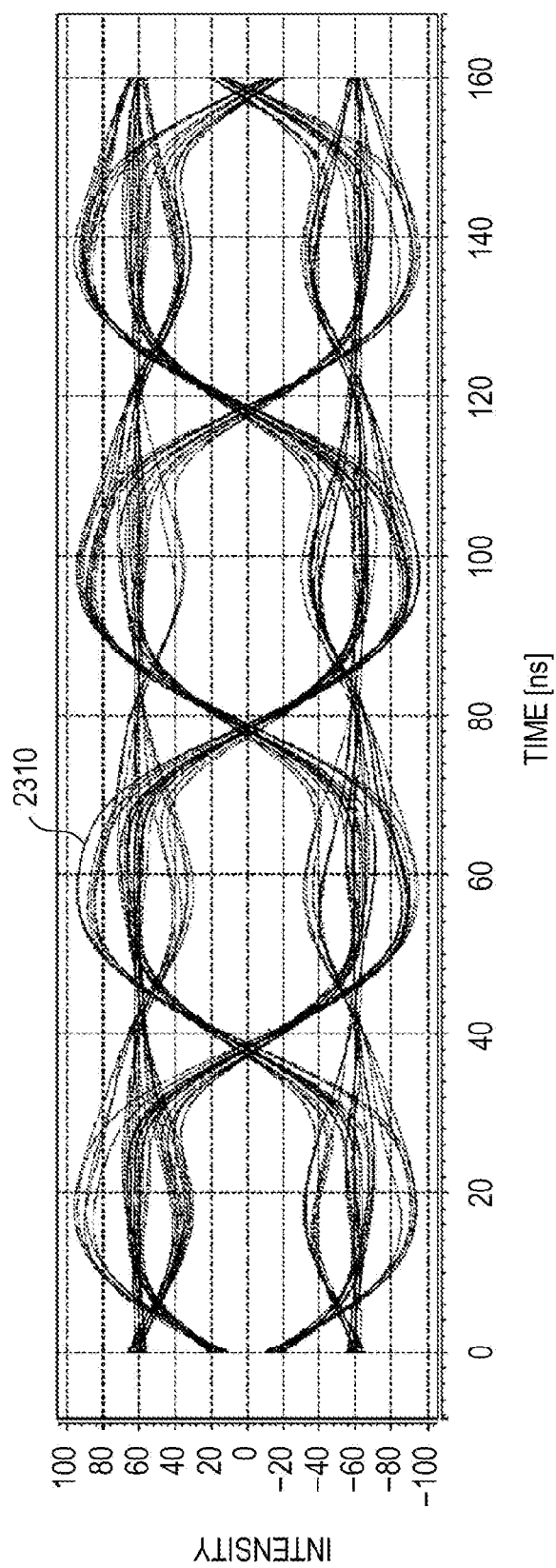
FIG. 23A illustrates an example of an eye pattern of a signal output from the signal shaping circuit illustrated in FIG. 16.
Figure 23B:
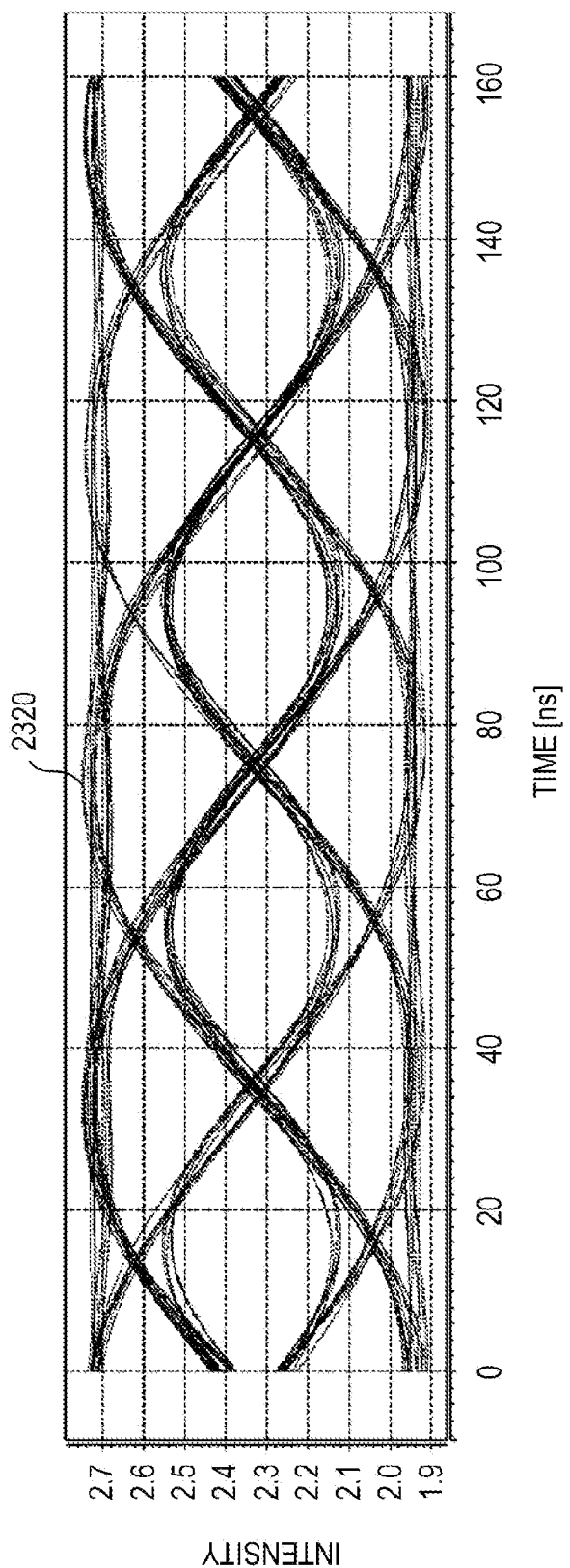
FIG. 23B illustrates an example of an eye pattern of light output from the light outputting element driven by the signal output from the signal shaping circuit illustrated in FIG. 16.

FIG. 23A illustrates an example of an eye pattern of the signal output from the signal shaping circuit 110 illustrated in FIG. 16. FIG. 23B illustrates an example of an eye pattern of light output from the light outputting element 610 driven by the signal output from the signal shaping circuit 110 illustrated in FIG. 16. An eye pattern 2310 illustrated in FIG. 23A is an eye pattern of the signal Data3 output from the (IIR type) signal shaping circuit 110 (provided with the high pass filter 1601) illustrated in FIG. 16. An eye pattern 2320 illustrated in FIG. 23B is an eye pattern of the light output from the light outputting element 610 driven by the signal Data3 output from the (IIR type) signal shaping circuit 110 (provided with the high pass filter 1601) illustrated in FIG. 16.

Figure 24A:
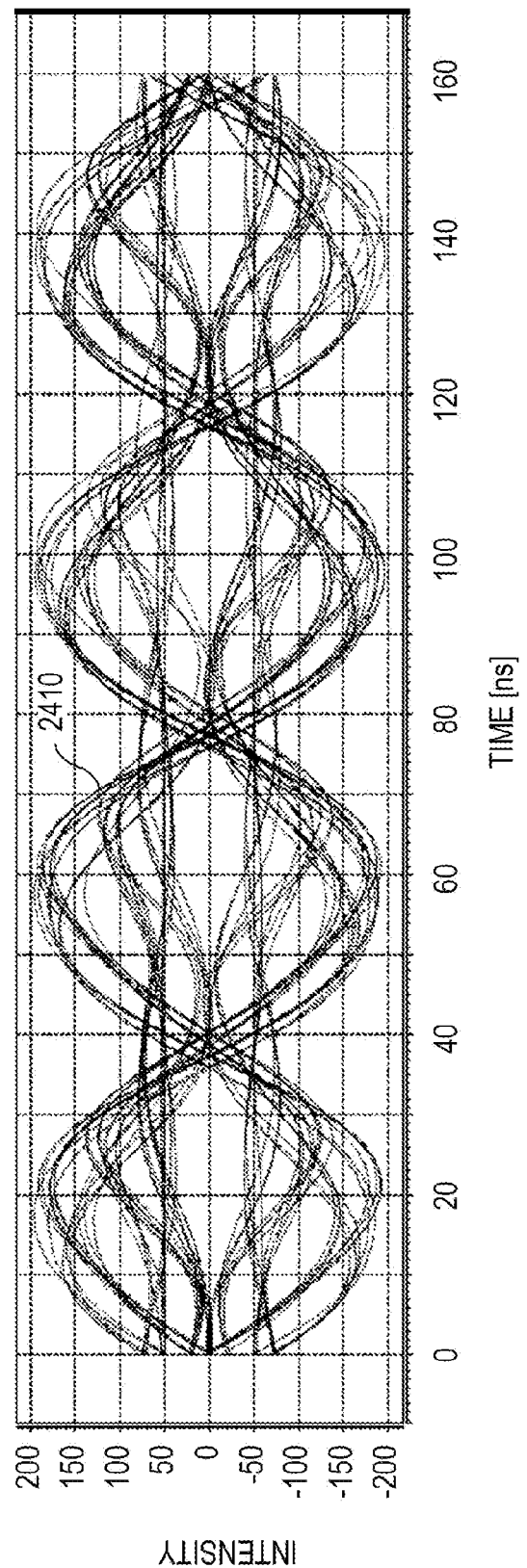
FIG. 24A illustrates, as a reference, an example of an eye pattern of a signal output from the signal shaping circuit illustrated in FIG. 21B.
Figure 24B:
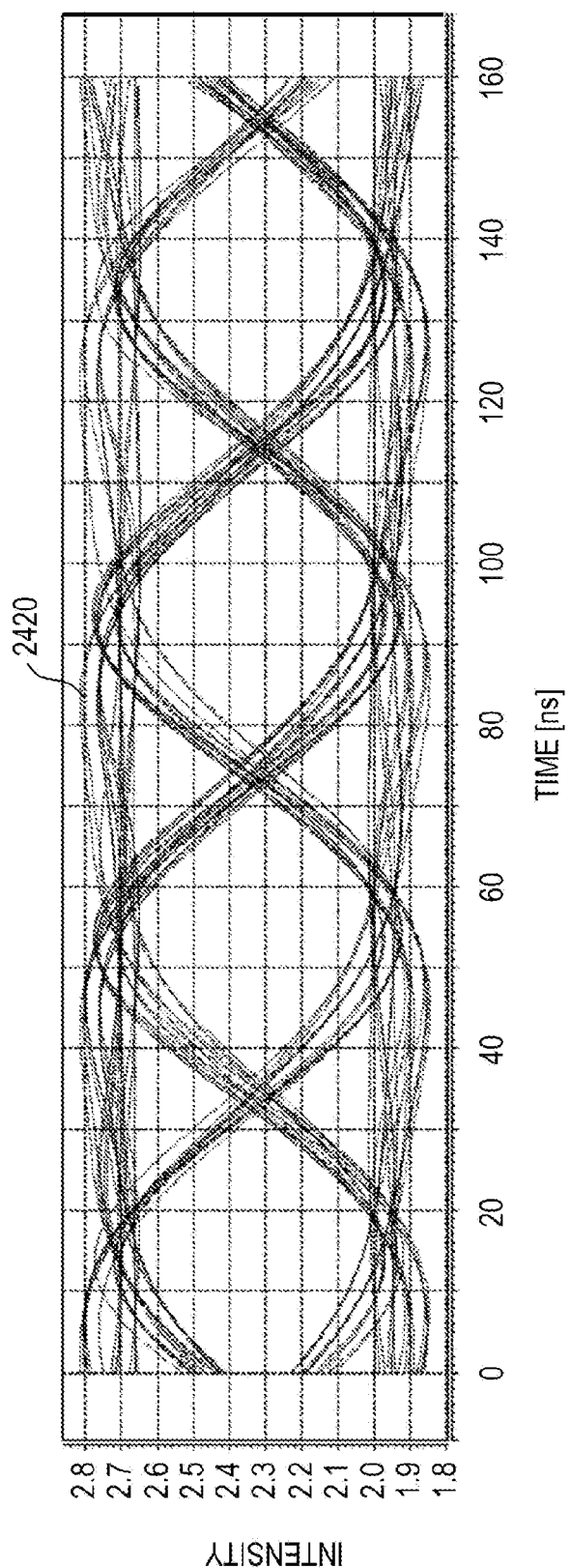
FIG. 24B illustrates an example of an eye pattern of light output from the light outputting element driven by the signal output from the signal shaping circuit illustrated in FIG. 21B.

Phase Characteristics of FIR and IIR Type Signal Shaping Circuit without High Pass Filter FIG. 24A illustrates, as a reference, an example of an eye pattern of the signal output from the signal shaping circuit 100 illustrated in FIG. 21B. FIG. 24B illustrates, as a reference, an example of an eye pattern of light output from the light outputting element 610 driven by the signal output from the signal shaping circuit 110 illustrated in FIG. 21B.

An eye pattern 2410 is illustrated in FIG. 24A as a reference and is an eye pattern of the signal data4 output from the (FIR and IIR type) signal shaping circuit 110 (without the high pass filter 1601) illustrated in FIG. 21B. An eye pattern 2420 is illustrated in FIG. 24B as a reference and is an eye pattern of the light output from the light outputting element 610 driven by the signal data4 output from the (FIR and IIR type) signal shaping circuit 110 (without the high pass filter 1601) illustrated in FIG. 21B.

Figure 25A:
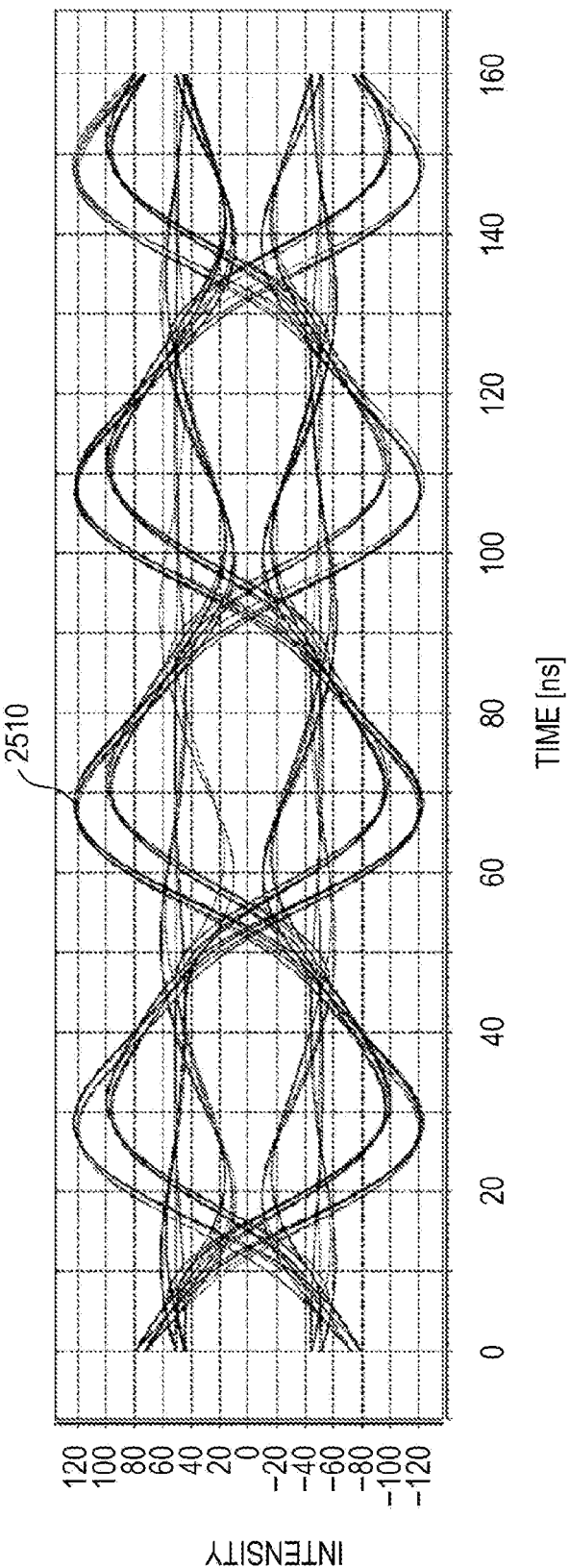
FIG. 25A illustrates an example of an eye pattern of a signal output from the signal shaping circuit illustrated in FIG. 21A.
Figure 25B:
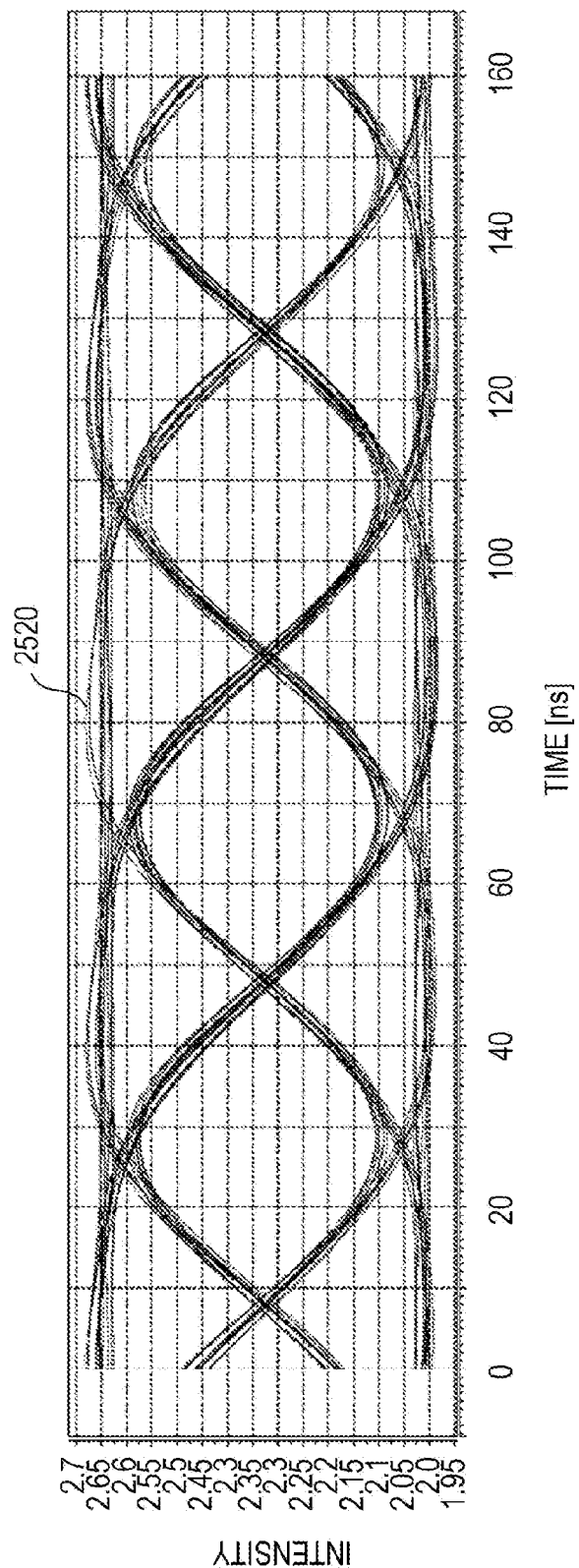
FIG. 25B illustrates an example of an eye pattern of light output from the light outputting element driven by the signal output from the signal shaping circuit illustrated in FIG. 21A.

Phase Characteristics of FIR and IIR Type Signal Shaping Circuit with High Pass Filter FIG. 25A illustrates an example of an eye pattern of the signal output from the signal shaping circuit 110 illustrated in FIG. 21A. FIG. 25B illustrates an example of an eye pattern of light output from the light outputting element 610 driven by the signal output from the signal shaping circuit 110 illustrated in FIG. 21A. An eye pattern 2510 illustrated in FIG. 25A is an eye pattern of the signal output from the (FIR and IIR type) signal shaping circuit 110 (provided with the high pass filter 1601) illustrated in FIG. 21A. An eye pattern 2520 illustrated in FIG. 25B is an eye pattern of the light output from the light outputting element 610 driven by the signal data4 output from the (FIR and IIR type) signal shaping circuit 110 (provided with the high pass filter 1601) illustrated in FIG. 21A.

As is apparent from a comparison of FIGS. 22A and 22B with FIGS. 23A and 23B, even when the IIR type signal shaping circuit 110 includes the high pass filter 1601, the phase characteristics of the light output from the light outputting element 610 driven by the output signal Data3 are not so specially improved.

As is apparent from a comparison of FIGS. 24A and 24B with FIGS. 25A and 25B, when the signal shaping circuit 110 that uses the FIR method and the IIR method includes the high pass filter 1601, the phase characteristics of each of the signals are improved by the high pass filter 1601. For example, the phase characteristics of the light output from the light outputting element 610 driven by the output signal data4 are improved.

As described above, the signal shaping circuit 110 according to the fourth embodiment uses the FIR method and the IIR method and includes the filter that attenuates a low-frequency component of the feedback signal data3. Thus, the phase characteristics of the light output from the light outputting element 610 driven by the output signal data4 may be improved. In addition, the light transmitting device 600 according to the fourth embodiment can improve the phase characteristics of the light output from the light outputting element 610. Thus, the quality of the signal light to be transmitted by the light outputting element 610 may be improved.

The signal shaping circuit 110 according to the fourth embodiment may adjust the gain and the like provided by the operational circuit 112, the delay element 114, the buffer circuit 115 and the like in a similar manner to the signal shaping circuit 110 according to the second embodiment, while the operational circuit 112, the delay element 114, the buffer circuit 115 are included in the IIR filter. Thus, a requested degree of the emphasis and a requested intensity of the signal are easily achieved, while the phase characteristics of the output signal data4 are improved.

In the embodiments, the outputting elements may use an electromagnetic wave outputting element such that the electromagnetic wave outputting element transmits a signal using at least one of a radio wave, terahertz wave, infrared light, and ultraviolet light.

As described above, each of the signal shaping circuit and the light transmitting device can flexibly shape a signal.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A signal shaping circuit, comprising:
   an operational circuit that provides weights to a first signal input to a first input element and a second signal input to a second input element, adds or subtracts the second signal to or from the first signal, and outputs a signal obtained by adding or subtracting the second signal to or from the first signal;
   a divider that divides the signal output from the operational circuit into signals, causes one of the divided signals to be input back into the second input element of the operational circuit, and outputs the other of the divided signal on a downstream side of the signal shaping circuit;
   a delay element that delays the signal output from the operational circuit and to be input to the divider or the signal output from the divider and to be input to the second input element; and
   an adjuster that adjusts at least one of the weights provided to the first and second signals at the operational circuit.

2. The signal shaping circuit according to claim 1, further comprising
   a filter that attenuates a predetermined low-frequency component of the signal output from the divider and to be input to the second input element.

3. The signal shaping circuit according to claim 2, further comprising
   a dividing delay circuit that divides an input signal into signals, provides the difference between delay times of the divided signals, and causes the signals delayed by the different delay times to be input to the first input element,
   wherein the operational circuit adds or subtracts the signal having the low-frequency component attenuated by the filter to or from the signals input to the first input element by the dividing delay circuit.

4. The signal shaping circuit according to claim 1,
   wherein the other of the divided signal is input to an electromagnetic wave outputting element that outputs a signal of electromagnetic waves having an intensity modulated based on the other of the divided signal output from the divider.

5. The signal shaping circuit according to claim 1,
wherein the operational circuit has an upper limit of an amplitude of the signal to be output from the operational circuit.

6. A light transmitting device comprising:
an operational circuit that provides weights to a first signal input to a first input element and a second signal input to a second input element, adds or subtracts the second signal to or from the first signal, and outputs a signal obtained by adding or subtracting the second signal to or from the first signal;
a divider that divides the signal output from the operational circuit into signals, causes one of the divided signals to be input back into the second input element of the operational circuit, and outputs the other of the divided signal on a downstream side of the signal shaping circuit;
a delay element that delays the signal output from the operational circuit and to be input to the divider or the signal output from the divider and to be input to the second input element;
an adjuster that adjusts at least one of the weights provided to the first and second signals by the operational circuit; and
an electromagnetic wave outputting element that outputs a signal of electromagnetic waves having an intensity modulated based on the other of the signal divided by the divider.

7. A signal shaping circuit comprising:
an operational circuit that adds or subtracts a second signal input to a second input element to or from a first signal input to a first input element and outputs a signal obtained by adding or subtracting the second signal to or from the first signal;
a divider that divides the signal output from the operational circuit into signals, causes one of the divided signals to be input back into the second input element of the operational circuit, and outputs the other of the divided signal on a downstream side of the signal shaping circuit;
a delay element that multiplies the signal output from the operational circuit and to be input to the divider or the signal output from the divider and to be input to the second input element by a given ratio and delays the multiplied signal; and
an adjuster that adjusts the given ratio to be used by the delay element.

8. The signal shaping circuit according to claim 7,
wherein the delay element has an upper limit of the amplitude of the multiplied signal to be output from the delay element.

9. A signal shaping circuit comprising:
an operational circuit that adds or subtracts a second signal input to a second input element to or from a first signal input to a first input element and outputs a signal obtained by adding or subtracting the second signal to or from the first signal;
a divider that divides the signal output from the operational circuit into signals, causes one of the divided signals to be input back into the second input element of the operational circuit, and outputs the other of the divided signal on a downstream side of the signal shaping circuit;
a delay element that delays the signal output from the operational circuit and to be input to the divider or the signal output from the divider and to be input to the second input element; and
a filter that attenuates a predetermined low-frequency component of the signal output from the divider and to be input to the second input element.

10. The signal shaping circuit according to claim 9, further comprising
an adjuster,
wherein the operational circuit provides weights to the first and second signals and adds or subtracts the second signal to or from the first signal, and
wherein the adjuster is capable of adjusting at least one of the weights provided to the first and second signals by the operational circuit.

11. The signal shaping circuit according to claim 9, further comprising
an adjuster,
wherein the delay element multiplies the signal output from the operational circuit and input to the divider or the signal output from the divider and to be input to the second input element by a given ratio and delays the multiplied signal, and
wherein the adjuster adjusts the given ratio to be used by the delay element.

12. The signal shaping circuit according to claim 9, further comprising
a dividing delay circuit that divides an input signal into signals, provides the difference between delay times of the divided signals, and causes the signals delayed by the different delay times to be input to the first input element,
wherein the operational circuit adds or subtracts the signal having the low-frequency component attenuated by the filter to or from the signals input to the first input element by the dividing delay circuit.

\* \* \* \* \*